(12) United States Patent
Iwaki

(10) Patent No.: US 10,840,249 B2
(45) Date of Patent: Nov. 17, 2020

(54) INTEGRATED CIRCUITRY CONSTRUCTIONS

(71) Applicant: Micron Technology, Inc., Boise, ID (US)

(72) Inventor: Takayuki Iwaki, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 204 days.

(21) Appl. No.: 16/110,421

(22) Filed: Aug. 23, 2018

(65) Prior Publication Data

US 2020/0066731 A1 Feb. 27, 2020

(51) Int. Cl.
*H01L 27/108* (2006.01)
*H01L 23/528* (2006.01)
*G11C 11/4091* (2006.01)

(52) U.S. Cl.
CPC ...... *H01L 27/10897* (2013.01); *H01L 23/528* (2013.01); *H01L 27/10808* (2013.01); *G11C 11/4091* (2013.01)

(58) Field of Classification Search
CPC ......... H01L 27/10897; H01L 27/10808; H01L 27/10823; H01L 27/108; H01L 27/10805;
(Continued)

(56) References Cited

U.S. PATENT DOCUMENTS 6,157,067 A * 12/2000 Hsu .................. H01L 27/10897
257/368
6,710,391 B2 * 3/2004 Houston ........... H01L 27/10811
257/295

(Continued)

FOREIGN PATENT DOCUMENTS

TW 201627739 8/2016
TW 201727859 8/2017
(Continued)

*Primary Examiner* — Errol V Fernandes
*Assistant Examiner* — Jeremy J Joy
(74) *Attorney, Agent, or Firm* — Wells St. John P.S.

(57) ABSTRACT

An integrated circuitry construction comprises a first area and a second area aside the first area. Laterally-alternating first and second conductive lines extend from the first area into the second area. The second conductive lines extend laterally deeper into the second area on one side of the first area than the first conductive lines and comprise pairs of immediately-laterally-adjacent of the second conductive lines. Insulative material is in the second area laterally between the immediately-laterally-adjacent second conductive lines in individual of the pairs. An elevationally-extending wall of insulator material is within the insulative material in the second area. The wall extends laterally between immediately-laterally-adjacent of the second conductive lines within the respective individual pair and laterally all across the first conductive line that is laterally between the immediately-laterally-adjacent second conductive lines within the respective individual pair. The insulator material is of different composition from that of the insulative material. Third conductive lines are in the second area above the second conductive lines. The third conductive lines individually directly electrically couple with individual of the second conductive lines through an elevationally-extending conductive via in the second area.

27 Claims, 30 Drawing Sheets

(58) Field of Classification Search
CPC ..... H01L 23/528–5283; G11C 11/4097; G11C 5/025
See application file for complete search history.

(56) References Cited

U.S. PATENT DOCUMENTS

| | | | |
|---|---|---|---|
| 7,372,092 B2* | 5/2008 | Manning | H01L 27/10823 257/296 |
| 8,829,602 B2* | 9/2014 | Juengling | H01L 27/10873 257/330 |
| 2002/0005590 A1* | 1/2002 | Keeth | H01L 27/10891 257/776 |
| 2006/0063345 A1* | 3/2006 | Manning | H01L 27/10852 438/387 |
| 2011/0127524 A1 | 6/2011 | Yamazaki et al. | |
| 2014/0077205 A1 | 3/2014 | Yamazaki et al. | |
| 2017/0148727 A1 | 5/2017 | Do et al. | |
| 2017/0213790 A1 | 7/2017 | Wang et al. | |
| 2018/0019245 A1* | 1/2018 | Yang | H01L 21/76877 |
| 2018/0151416 A1 | 5/2018 | Wu et al. | |

FOREIGN PATENT DOCUMENTS

| | | |
|---|---|---|
| TW | 201729384 | 8/2017 |
| TW | 201742255 | 12/2017 |
| TW | 201824491 | 7/2018 |
| TW | 108113735 | 4/2020 |
| WO | WO PCT/US2019/025759 | 7/2019 |

* cited by examiner

INTEGRATED CIRCUITRY CONSTRUCTIONS

TECHNICAL FIELD

Embodiments disclosed herein pertain to constructions of integrated circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1. In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

A field effect transistor is another type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Regardless, the gate insulator may be programmable, for example being ferroelectric.

A continuing goal in fabrication of memory and other circuitry is to make ever-smaller and closer-spaced components. Some memory circuitry has peripheral circuitry aside the memory array having circuitry that reads from and writes to the memory cells in the memory array. Digitlines and wordlines extend from the memory array area into the peripheral circuitry area. The digitlines, for example, connect with higher (i.e., positionally) conductive lines in the peripheral circuitry area through elevationally-extending conductive vias. Some designs comprise laterally-alternating first and second digitlines that extend from one side of the memory array area into the peripheral area, with one of the first or second digitlines extending laterally deeper into the peripheral area on the one side than do the other of the first or second digitlines. On the opposite side of the memory array area, that relationship is reversed.

While the invention was motivated in overcoming some problems that may occur with respect to fabrication of the above-described circuitry, the invention is in no way so limited, nor is it everywhere limited to fabrication of memory circuitry.

DETAILED DESCRIPTION OF EXAMPLE EMBODIMENTS

Figure 1A:
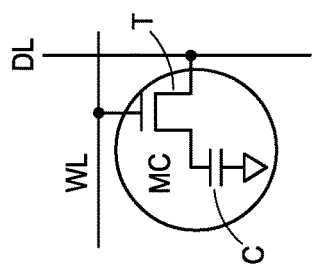
FIG. 1A is an enlargement of a portion of FIG. 1.
Figure 1:
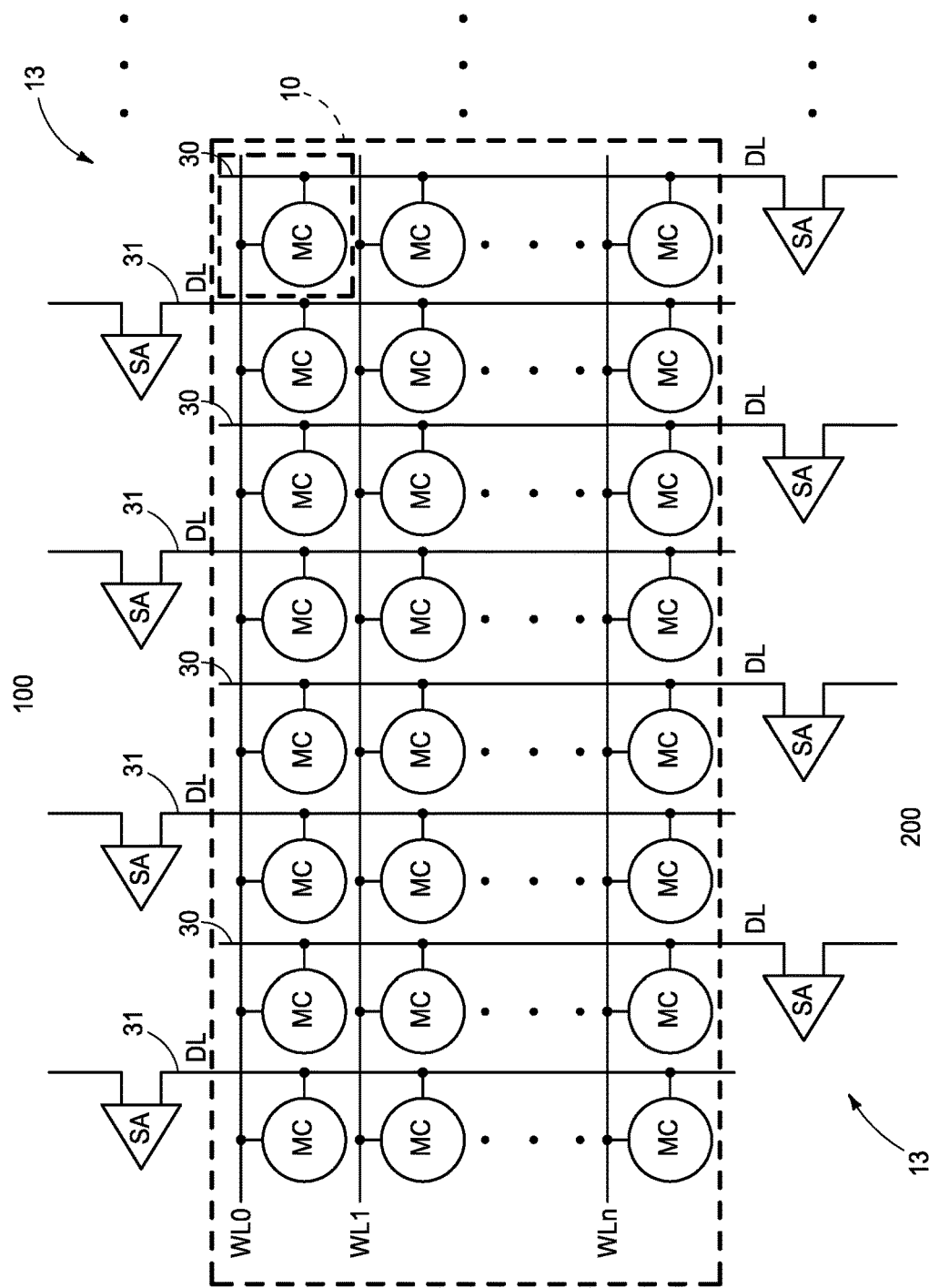
FIG. 1 is a diagrammatic schematic of a DRAM memory array and peripheral circuitry in accordance with the prior art and in accordance with an embodiment of the invention.

Embodiments of the invention encompass integrated circuitry constructions, such as memory integrated circuitry constructions including, for example DRAM circuitry constructions. One example prior art schematic diagram of DRAM circuitry, and in accordance with an embodiment of the invention, is shown in FIGS. 1 and 1A. FIG. 1A shows example memory cells MC individually comprising a transistor T and a capacitor C. One electrode of capacitor C is directly electrically coupled to a suitable potential (e.g., ground) and the other capacitor electrode is contacted with or comprises one of the source/drain regions of transistor T. The other source/drain region of transistor T is directly electrically coupled with a digitline 30 or 31 (also individually designated as DL). The gate of transistor T is directly electrically coupled with (e.g., comprises part of) a wordline WL. FIG. 1 shows digitlines 30 and 31 extending from one of opposite sides 100 and 200 of a memory array area 10 into a peripheral area 13 that is aside memory array area 10. Digitlines 30 and 31 individually directly electrically couple with a sense amp SA on opposite sides 100 and 200 of array area 10 within peripheral circuitry area 13.

An example embodiment comprising DRAM is next described with reference to FIGS. 2-11 showing an example fragment of a substrate construction 8 comprising memory array area 10 and peripheral area 13 aside memory array area 10 (i.e., laterally immediately-adjacent to or laterally spaced from the memory array), and each of which has been fabricated relative to a base substrate 11. Memory array area 10 comprises memory cells MC and peripheral area 13 comprises peripheral circuitry (e.g., sense amps SA [not shown], conductive lines extending thereto and therefrom [not shown, but for digitlines 30, 31], and other circuit components [not shown]). Such circuitry enables reading from and writing to memory cells MC that are in memory array area 10. Base substrate 11 may comprise any one or more of conductive/conductor/conducting (i.e., electrically herein), semiconductive/semiconductor/semiconducting, and insulative/insulator/insulating (i.e., electrically herein) materials. Various materials are above base substrate 11. Materials may be aside, elevationally inward, or elevationally outward of the FIGS. 2-11—depicted materials. For example, other partially or wholly fabricated components of integrated circuitry may be provided somewhere above, about, or within base substrate 11. Some control and/or other peripheral circuitry for operating components within a memory array may also be provided and may or may not be wholly or partially within a memory array or sub-array. Further, multiple sub-arrays may also be provided and operated independently, in tandem, or otherwise relative one another. As used in this document, a "sub-array" may also be considered as an array. In accordance with embodiments comprising memory cells within a memory array area, at least some peripheral circuitry to read from and write to the memory cells in the memory array area is within a peripheral area that is the aside memory array area.

Base substrate 11 comprises semiconductive material 12 (e.g., appropriately and variously doped monocrystalline and/or polycrystalline silicon, Ge, SiGe, GaAs, and/or other existing or future-developed semiconductive material), trench isolation regions 14 (e.g., silicon nitride and/or silicon dioxide), and active area regions 16 comprising suitably and variously-doped semiconductive material 12. In one embodiment, construction 8 comprises DRAM memory cells MC (FIGS. 9-11, and with only four outlines MC shown in FIGS. 9 and 10 for clarity in such figures), for example DRAM memory cells individually comprise a field effect transistor device 25 (e.g., designated as a transistor T in FIG. 1A, and as transistors 25 in FIGS. 2 and 8) and a charge-storage device (e.g., a capacitor designated as C in FIG. 1A, and as a capacitor 85 in FIGS. 3, 4, and 11). However, embodiments of the invention encompass other memory cells and other constructions of integrated circuitry independent of whether containing memory cells. In one embodiment comprising memory cells having a transistor and a capacitor, individual memory cells have one and only one transistor and one and only one capacitor (i.e., 1T-1C).

Field effect transistors 25 are in the form of recessed access devices (a type of construction of a field effect transistor), with example construction 8 showing such recessed access devices grouped in individual pairs of such devices. Individual recessed access devices 25 include a buried access line construction 18, for example that is within a trench 19 in semiconductive material 12. Constructions 18 comprise conductive gate material 22 (e.g., conductively-doped semiconductor material and/or metal material) that functions as a conductive gate of individual devices 25. A gate insulator 20 (e.g., silicon dioxide and/or silicon nitride) is along sidewalls 21 and a base 23 of individual trenches 19 between conductive gate material 22 and semiconductive material 12. Insulator material 37 (e.g., silicon dioxide and/or silicon nitride) is within trenches 19 above materials 20 and 22. Individual devices 25 comprise a pair of source/ drain regions 24, 26 in upper portions of semiconductive material 12 on opposing sides of individual trenches 19 (e.g., regions 24, 26 being laterally outward of and higher than access line constructions 18). Each of source/drain regions 24, 26 comprises at least a part thereof having a conductivity-increasing dopant therein that is of maximum concentration of such conductivity-increasing dopant within the respective source/drain region 24, 26, for example to render such part to be conductive (e.g., having a maximum dopant concentration of at least $10^{19}$ atoms/cm$^3$). Accordingly, all or only a part of each source/drain region 24, 26 may have such maximum concentration of conductivity-increasing dopant. Source/drain regions 24 and/or 26 may include other doped regions (not shown), for example halo regions, LDD regions, etc.

One of the source/drain regions (e.g., region 26) of the pair of source/drain regions in individual of the pairs of recessed access devices 25 is laterally between conductive gate material 22 and is shared by the pair of devices 25. Others of the source/drain regions (e.g., regions 24) of the pair of source/drain regions are not shared by the pair of devices 25. Thus, in the example embodiment, each active area region 16 comprises two devices 25 (e.g., one pair of devices 25), with each sharing a central source/drain region 26. Digitlines 30 and 31 individually directly electrically couple to the one shared source/drain region 26 of multiple of the individual pairs of devices 25. For example, and as shown, elevationally-extending conductive vias 34 (e.g., metal material and/or conductively-doped semiconductive material) are spaced longitudinally along digitlines 30, 31, and individually directly electrically couple digitlines 30, 31 to individual shared source/drain regions 26 of the individual pairs of devices 25. A pair of capacitors 85 individually are directly electrically coupled to one of the other source/drain regions 24 in the individual pairs of devices 25. Elevationally-extending conductive vias 36 (same or different composition from that of vias 34) are shown interconnecting non-shared source/drain regions 24 with individual capacitors 85. Example insulator/insulative material 38, 40, 43, 58, and/or 59 (e.g., silicon nitride and/or silicon dioxide) surrounds vias 34, 36.

A channel region 27 (FIGS. 11 and 3) is in semiconductive material 12 below pair of source/drain regions 24, 26 along trench sidewalls 21 (FIG. 11) and around trench base 23. Channel region 27 may be suitably doped with a conductivity-increasing dopant likely of the opposite conductivity-type of the dopant in source/drain regions 24, 26, and for example that is at a maximum concentration in the channel of no greater than $1 \times 10^{17}$ atoms/cm$^3$. When suitable voltage is applied to gate material 22 of an access line construction 18, a conductive channel forms (e.g., along a channel current-flow line/path 29 [FIG. 11]) within channel region 27 proximate gate insulator 20 such that current is capable of flowing between a pair of source/drain regions 24 and 26 under the access line construction 18 within an individual active area region 16. Stippling is diagrammatically shown to indicate primary conductivity-modifying dopant concentration (regardless of type), with denser stippling indicating greater dopant concentration and lighter stippling indicating lower dopant concentration. Conductivity-modifying dopant may be, and would likely be, in other portions of material 12 as shown. Only two different stippling densities are shown in material 12 for convenience, and additional dopant concentrations may be used and constant dopant concentration is not required in any region.

Example digitlines 30 and 31 individually comprise conductive material 42 (same or different composition from that of conductive vias 34 and/or 36) that is directly electrically coupled to conductive vias 34 and extends between immediately-longitudinally-adjacent of conductive vias 34. Upper insulator material 50 (e.g., silicon nitride and/or silicon dioxide) is above and insulator material 38 is aside conductive material 42. Doped or undoped semiconductor material 46 is between immediately-longitudinally-adjacent conductive vias 34. Lower insulative material 48 (e.g., one or more of silicon dioxide, silicon nitride, aluminum dioxide, hafnium oxide, etc.; e.g., thickness of 50 to 200 Angstroms) is below semiconductor material 46 between immediately-longitudinally-adjacent conductive vias 34. As alternate examples, material 46 may comprise insulative material or metal material or be eliminated, with conductive material 42 extending inwardly to lower insulative material 48 (not shown).

Figure 2:
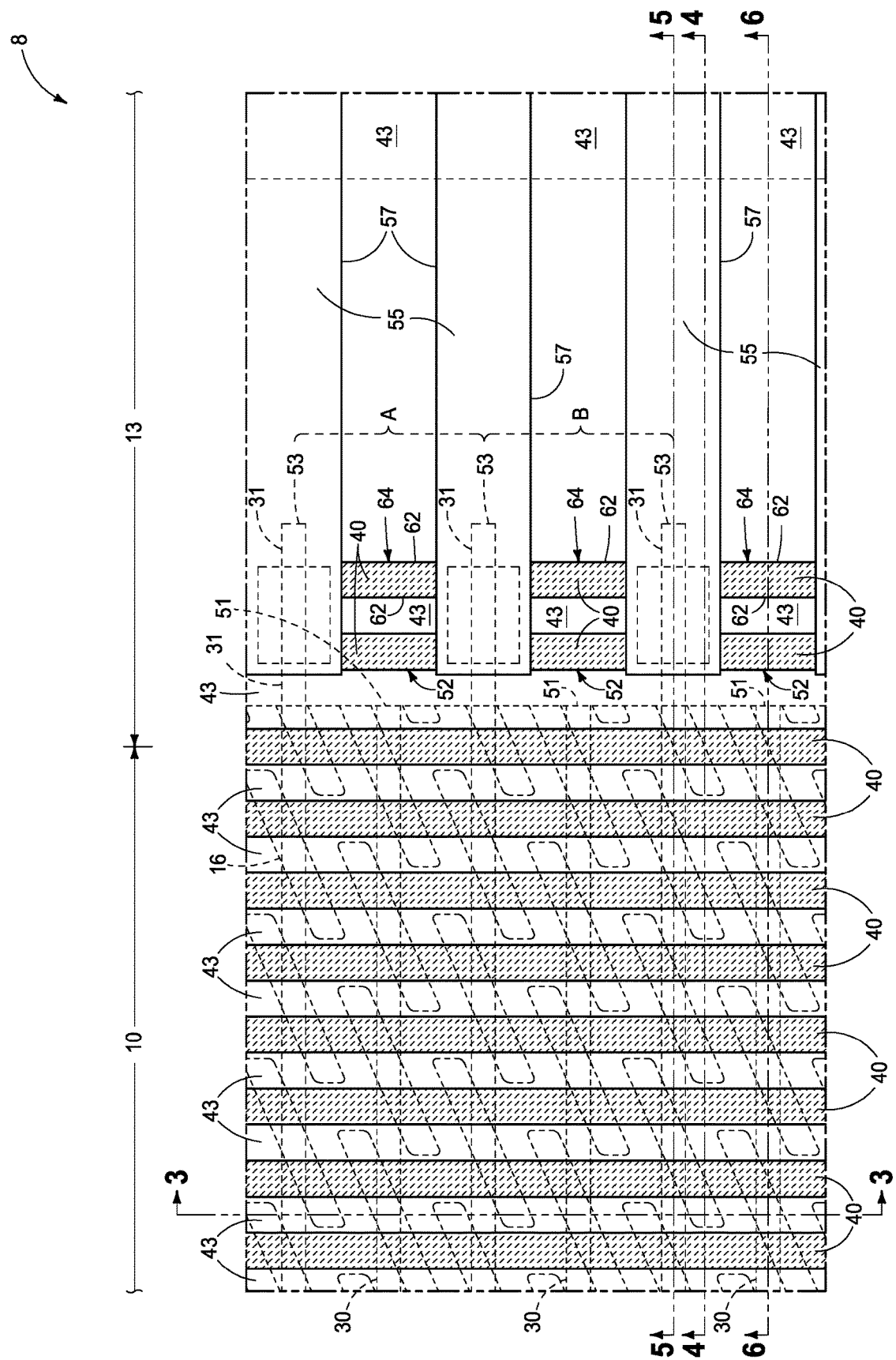
FIG. 2 is a diagrammatic cross-sectional view of a portion of a DRAM construction in accordance with an embodiment of the invention and is taken through line 2-2 in FIGS. 3-6 and 11.
Figure 3:
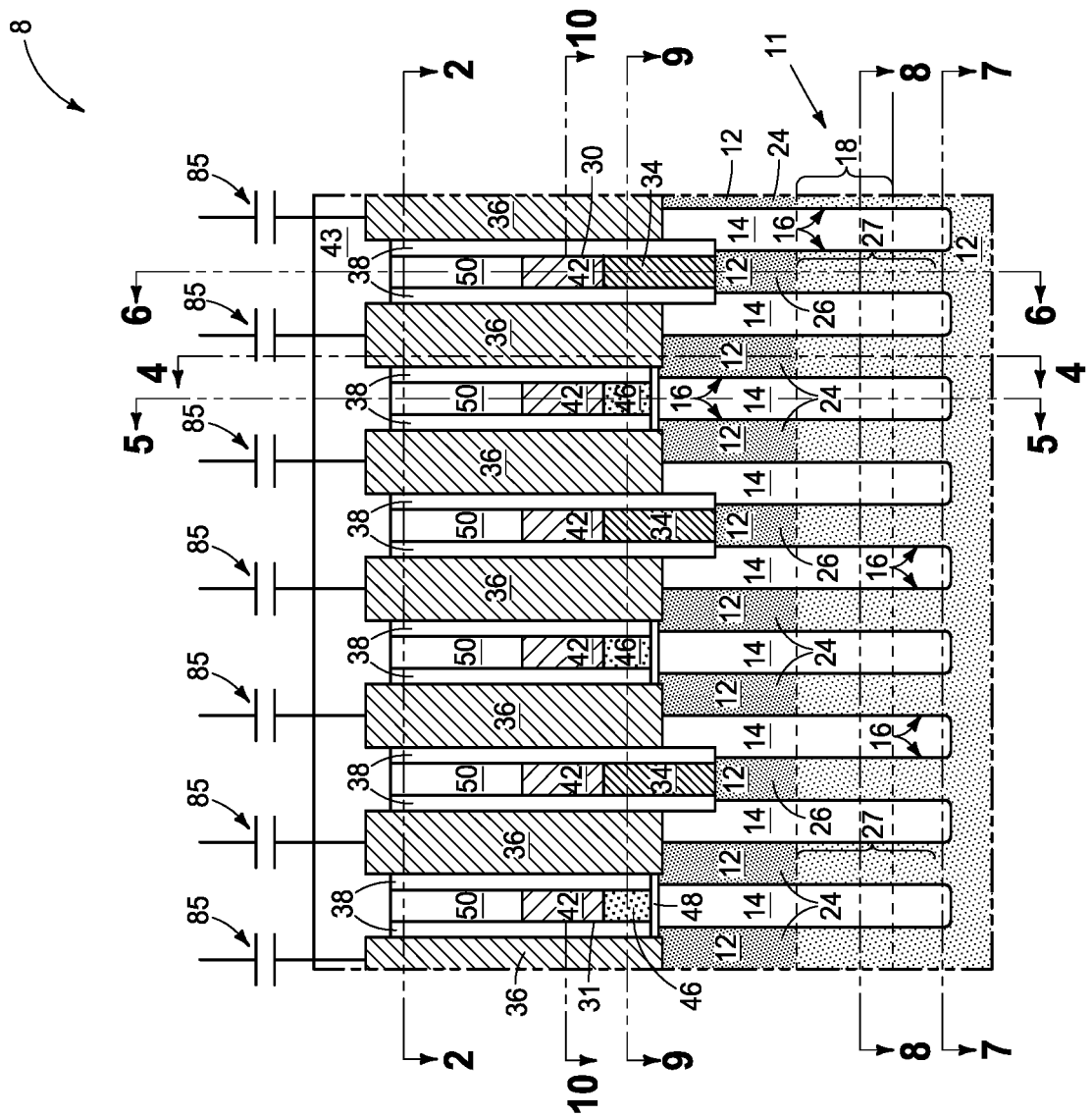
FIG. 3 is a view taken through line 3-3 in FIGS. 2, 8, 9, and 10, and is a hybrid schematic view.
Figure 9:
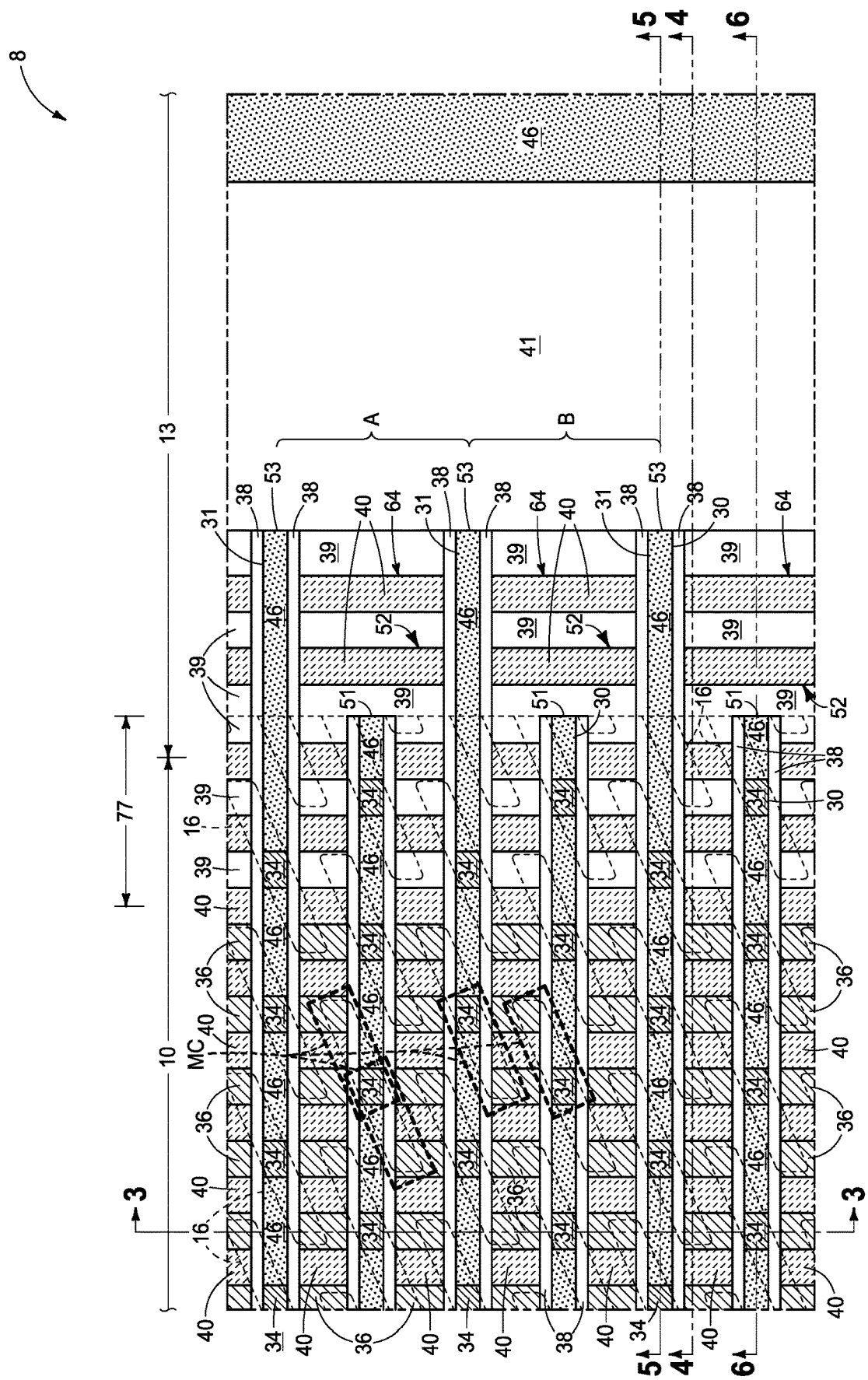
FIG. 9 is a view taken through line 9-9 in FIGS. 3-6.
Figure 10:
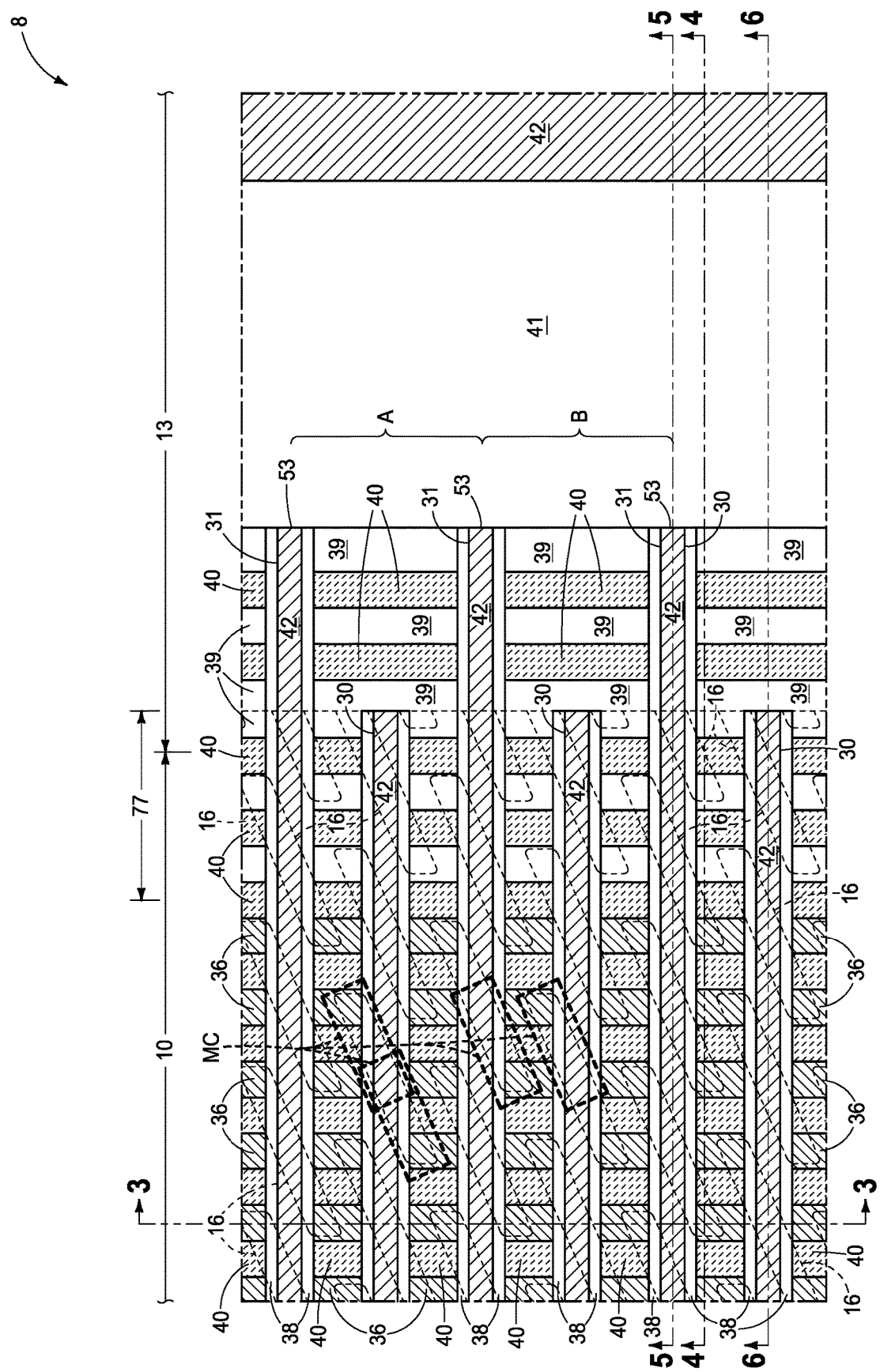
FIG. 10 is a view taken through line 10-10 in FIGS. 3-6.
Figure 11:
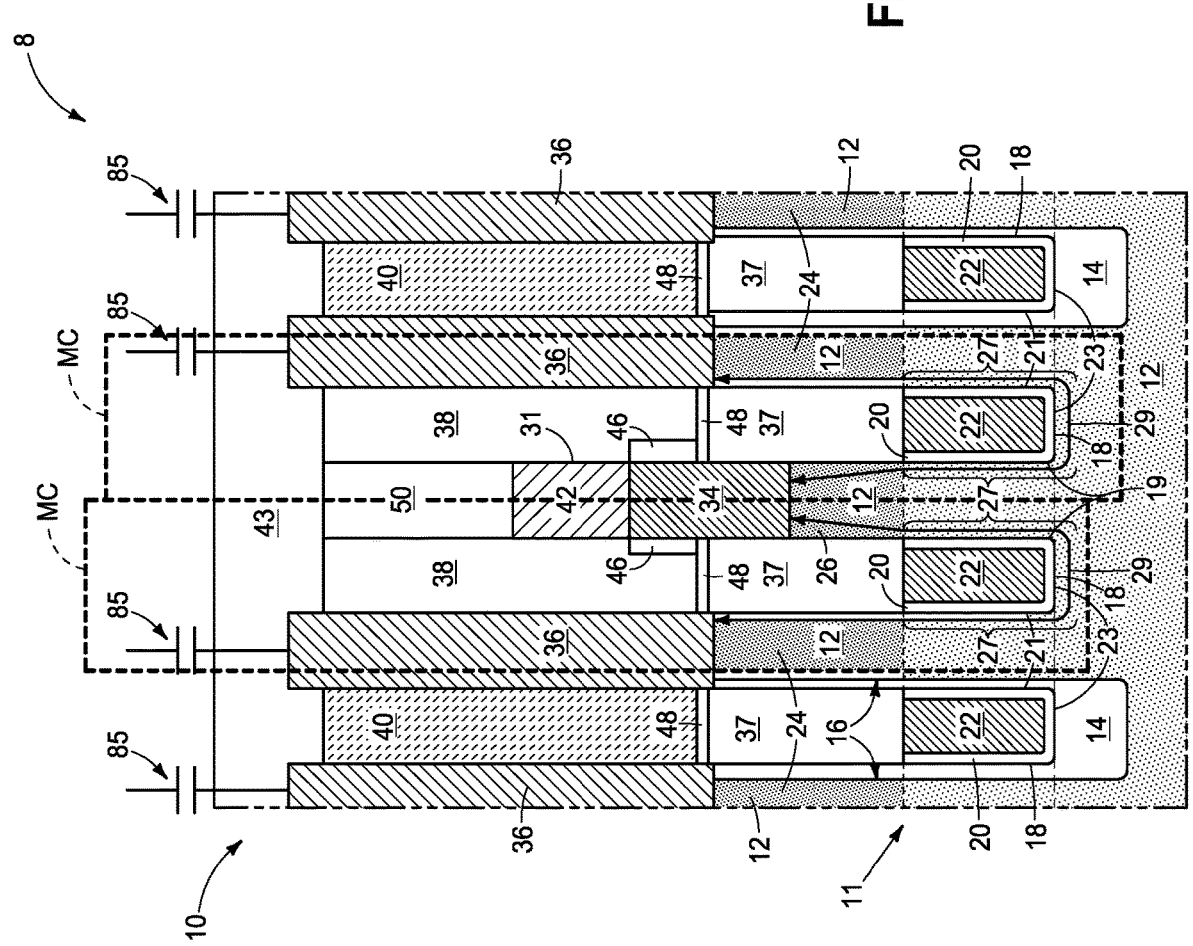
FIG. 11 is a view taken through line 11-11 in FIG. 8 and is a hybrid schematic view.

Digitlines 30 and 31 may be considered as laterally-alternating first digitlines 30 and second digitlines 31 that extend from memory array area 10 into peripheral area 13, with second digitlines 31 extending laterally deeper into peripheral area 13 on one side (i.e., at least one side) of memory array area 10 than first digitlines 30. Use of "first" and "second" herein with respect to digitlines or other conductive lines herein is for convenience only in distinguishing laterally-alternating such lines one of which extends laterally deeper into a peripheral or second area than do the other of the first or second stated digitlines or conductive lines, and with respect to one side of a memory array area or first area. First digitlines 30 may be considered as having respective longitudinal ends 51 in peripheral area 13 and second digitlines 31 may be considered as having respective longitudinal ends 53 in peripheral area 13. While the example embodiment shows first digitlines 30 laterally-alternating with each second digitline 31, alternate laterally-alternating embodiments may be used (e.g., two or more first digitlines being between immediately-adjacent second digitlines or two or more second digitlines being between immediately-adjacent first digitlines, and neither of which is shown). Regardless, immediately-laterally-adjacent second digitlines 31 may be considered as comprising pairs (e.g., a pair A and a pair B) as shown in FIGS. 2, 9, and 10) of such digitlines.

Insulative material 43 is in peripheral area 13 laterally between immediately-laterally-adjacent second digitlines 31 in individual of pairs A and B. In one embodiment, insulative material 43 is laterally between (a) and (b), where (a) is the first digitline 30 that is laterally between immediately-laterally-adjacent second digitlines 31 within the respective individual pair A and B, and (b) is each of immediately-laterally-adjacent second digitlines 31 within the respective individual pair A and B. In one embodiment, insulative material 43 is directly against first and second digitlines 30 and 31, respectively (e.g., along sidewalls thereof).

An elevationally-extending wall 52 of insulator material 40 is within insulative material 43 in peripheral area 13. Wall 52 extends laterally between immediately-laterally-adjacent second digitlines 31 within individual pairs A and B, and laterally all across the first digitline 30 that is laterally between immediately-laterally-adjacent second digitlines 31 within the respective individual pair A and B. Insulator material 40 and/or insulative material 43 may be homogenous or non-homogenous. Insulator material 40 is of different composition from that of insulative material 43. In one embodiment, one of insulative material 43 and insulator material 40 is silicon dioxide and the other is silicon nitride. In one embodiment, insulative material 43 is silicon dioxide and insulator material 40 is silicon nitride. In one embodiment, wall 52 is everywhere spaced from (c) and (d), where (c) is longitudinal end 51 of the first digitline 30 that is laterally between immediately-laterally-adjacent second digitlines 31 within the respective individual pair A and B, and (d) is longitudinal end 53 of each of immediately-laterally-adjacent second digitlines 31 within the respective individual pair A and B.

In one embodiment, wall 52 is taller than first digitlines 30 and second digitlines 31, and regardless in one embodiment wall 52 extends vertically deeper in construction 8 than first digitlines 30 and second digitlines 31 (if material 46 is not conductive). In one embodiment, wall 52 is nowhere directly against the first digitline 30 that is laterally between immediately-laterally-adjacent second conductive lines 31 within the respective individual pair A and B, with in one such embodiment wall 52 being everywhere spaced from longitudinal end 51 of first digitline 30 that is laterally between immediately-laterally-adjacent second conductive lines 31 within the respective individual pair A and B. In one embodiment, insulative material 43 is between wall 52 and longitudinal end 51, and in one such embodiment is directly against each. In one embodiment, wall 52 is everywhere spaced from longitudinal end 53 of each of immediately-laterally-adjacent second digitlines 31 within the respective individual pair A and B, and in one such embodiment insulative material 43 is between wall 52 and longitudinal ends 53.

The integrated circuitry construction may comprise one or more elevationally-extending walls of insulator material 40 (e.g., that are laterally or otherwise spaced from one another). For example, integrated circuitry construction 8 is shown as comprising another elevationally-extending wall 64 of insulator material 40 in peripheral area 13 that is spaced (e.g., laterally) from the first-stated elevationally-extending wall 52. Wall 64 extends laterally between immediately-laterally-adjacent second digitlines 31 within the respective individual pair A and B, and laterally all across the first digitline 30 that is laterally between such second digitlines 31. Wall 64 may be considered as comprising longitudinal sides 62 (FIG. 2). In one embodiment, wall 64 extends vertically deeper than first digitlines 30 and second digitlines 31 (if material 46 is not conductive). In one embodiment, insulative material 43 extends longitudinally along both sides 62 of wall 64, and in one such embodiment is directly against insulator material 40 of wall 64 on both sides 62 of wall 64. The same such attributes may apply with respect to wall 52. Where, for example, only one wall of insulator material 40 is within insulative material 43, either may be positioned as are either of walls 52 and 64, or otherwise.

Conductive lines 55 are in peripheral area 13 above second digitlines 31 (i.e., at least above second digitlines 31). Conductive lines 55 individually directly electrically couple with individual second digitlines 31 through an elevationally-extending conductive via 56 in peripheral area 13. In one embodiment, wall 52 and/or 64 is directly against at least one of elevationally-extending conductive via 56 or line 55, and in one such embodiment is directly against a sidewall 57 of one (i.e., at least one) elevationally-extending conductive line 55. In one embodiment, wall 52 and/or 64 is directly against facing sidewalls 57 of two immediately-laterally-adjacent elevationally-extending conductive lines 55. In one embodiment, wall 52 and/or 64 does not extend across any of conductive vias 56 in peripheral area 13, or alternately does so extend (not shown). Memory array area 10 may comprise a dummy portion 77 (FIGS. 9 and 10, for example which may not contain any operative memory cells MC). Any other attribute(s) or aspect(s) as shown and/or described herein with respect to other embodiments may be used.

Embodiments of the invention also comprise an integrated circuitry construction (e.g., 8) independent of whether associated with memory. Such a construction comprises a first area (e.g., 10 and regardless of whether being a memory array area and regardless of whether comprising memory cells) and a second area aside the first area (e.g., 13, and regardless of whether being immediately-laterally-adjacent the first area or laterally spaced therefrom, and regardless of whether comprising circuitry to control or otherwise determine operational aspects of circuitry within the first area). Laterally alternating first and second conductive lines (e.g., 30 and 31, respectively, and regardless of whether such are digitlines) extend from the first area into the second area, with the second conductive lines extending laterally deeper into the second area on one (i.e., at least one) side of the first area than the first conductive lines. The second conductive lines comprise pairs (e.g., A and B) of immediately-laterally-adjacent of the second conductive lines. Insulative material (e.g., 43) is in the second area laterally between the immediately-laterally-adjacent second conductive lines in individual of the pairs.

An elevationally-extending wall (e.g., 52 or 64) of insulator material (e.g., 40) is within the insulative material in the second area. The wall extends laterally between immediately-laterally-adjacent of the second conductive lines within the respective individual pair and laterally all across the first conductive line that is laterally between the immediately-laterally-adjacent second conductive lines within the respective individual pair. The insulator material is of different composition from that of the insulative material.

Third conductive lines (e.g., 55) in the second area are above the second conductive lines. The third conductive lines individually directly electrically couple with individual of the second conductive lines through an elevationally-extending conductive via (e.g., 56) in the second area. Any other attribute(s) or aspect(s) as shown and/or described herein with respect to other embodiments may be used.

Structure of the above-described embodiments may be fabricated using any existing and/or future-developed techniques. One example method of doing so is largely next-described with reference to FIGS. 12-30 with respect to predecessor substrates. Like-numerals have been used as described above and/or shown in FIGS. 1-11 for predecessor constructions and materials.

Figure 4:
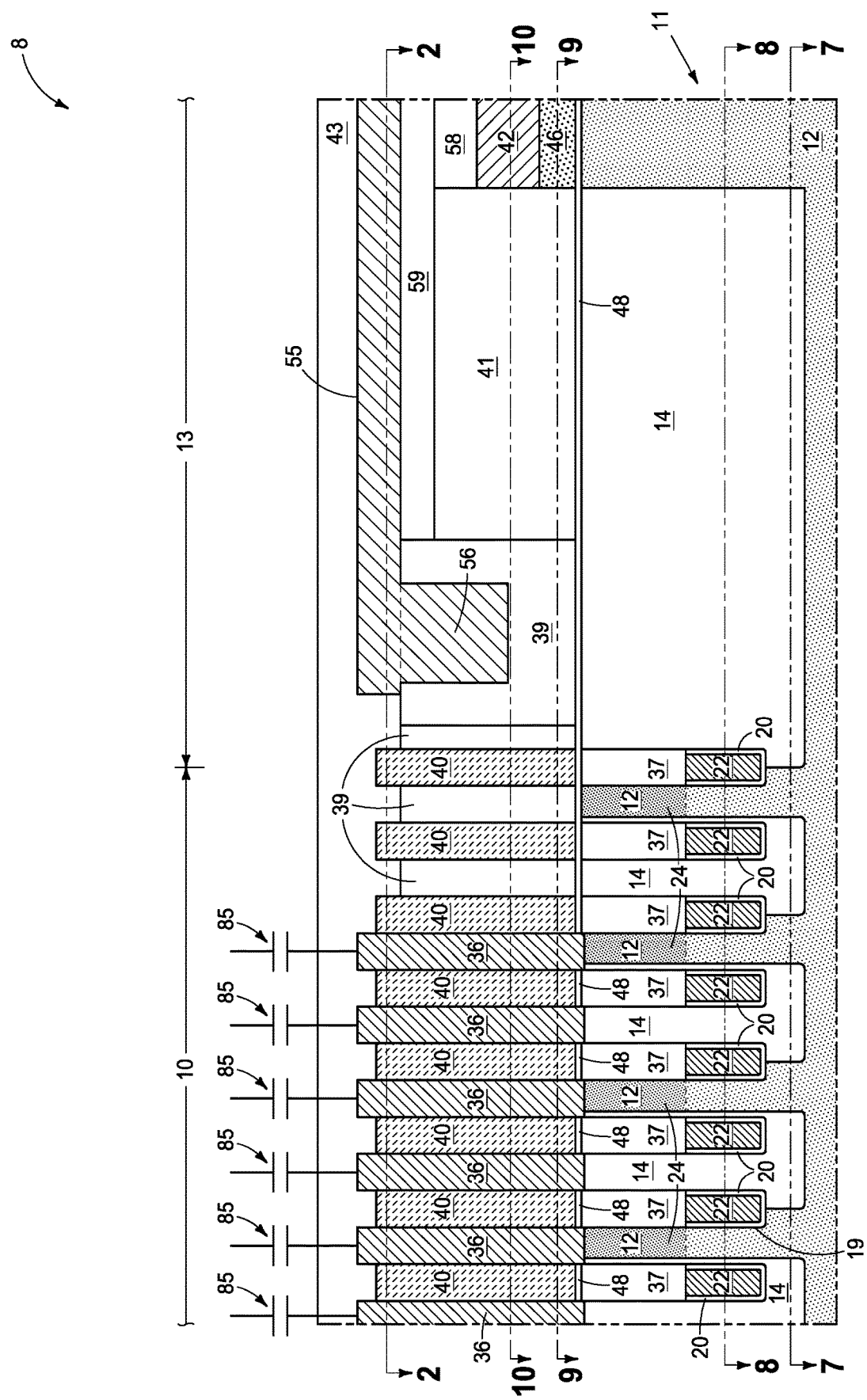
FIG. 4 is a view taken through line 4-4 in FIGS. 2, 3, and 7-10.
Figure 5:
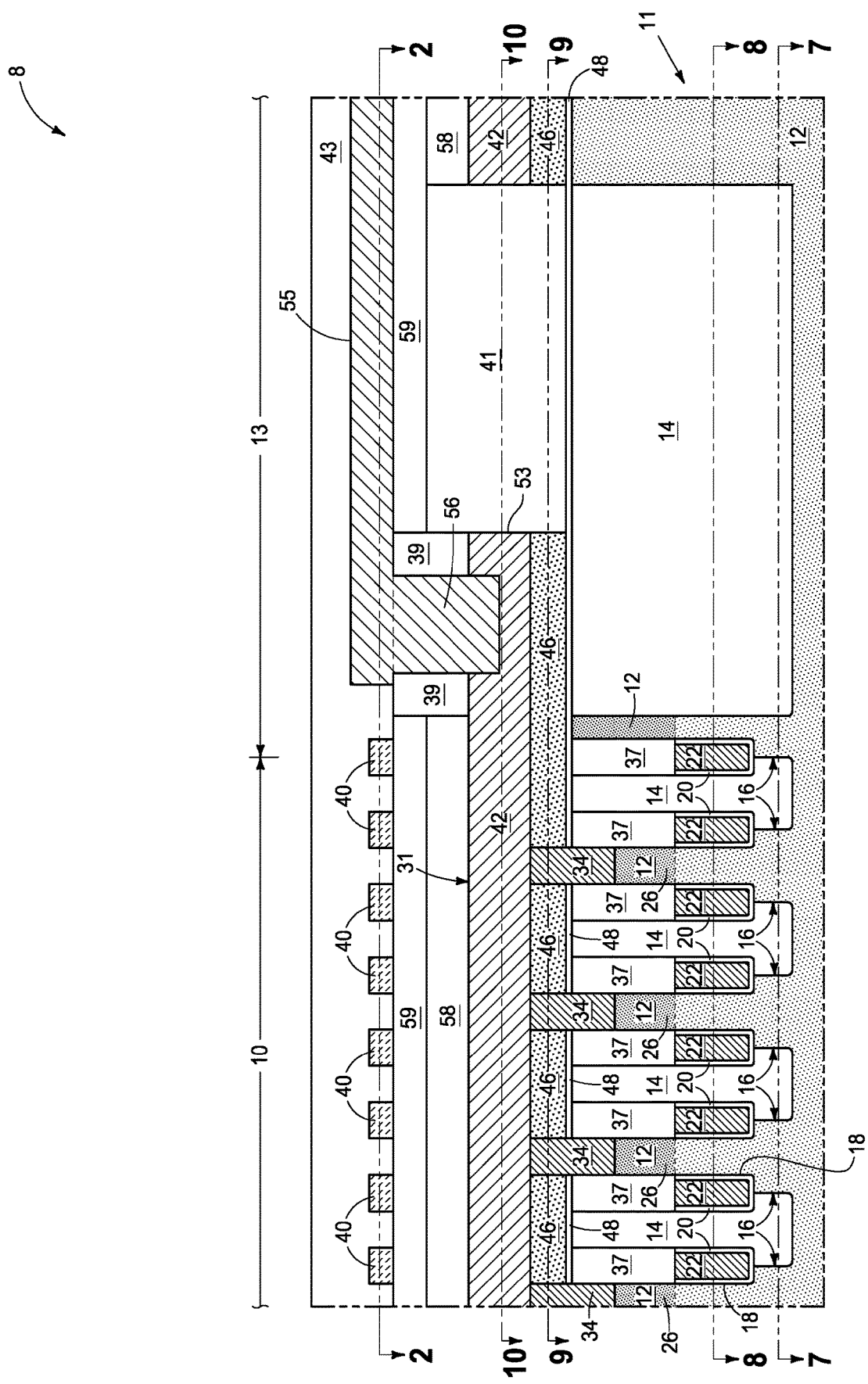
FIG. 5 is a view taken through line 5-5 in FIGS. 2, 3, and 7-10.
Figure 6:
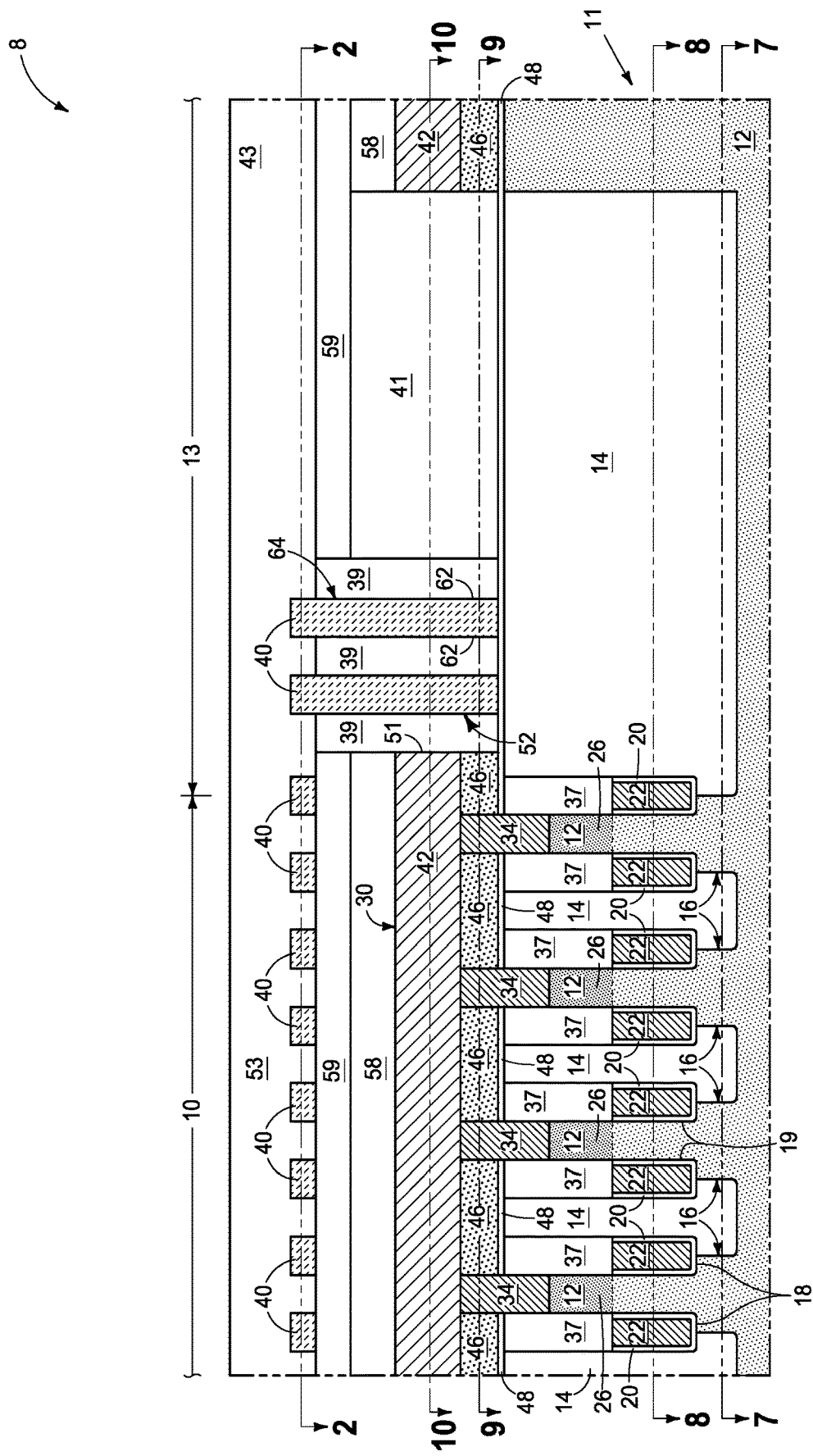
FIG. 6 is a view taken through line 6-6 in FIGS. 2, 3, and 7-10.
Figure 7:
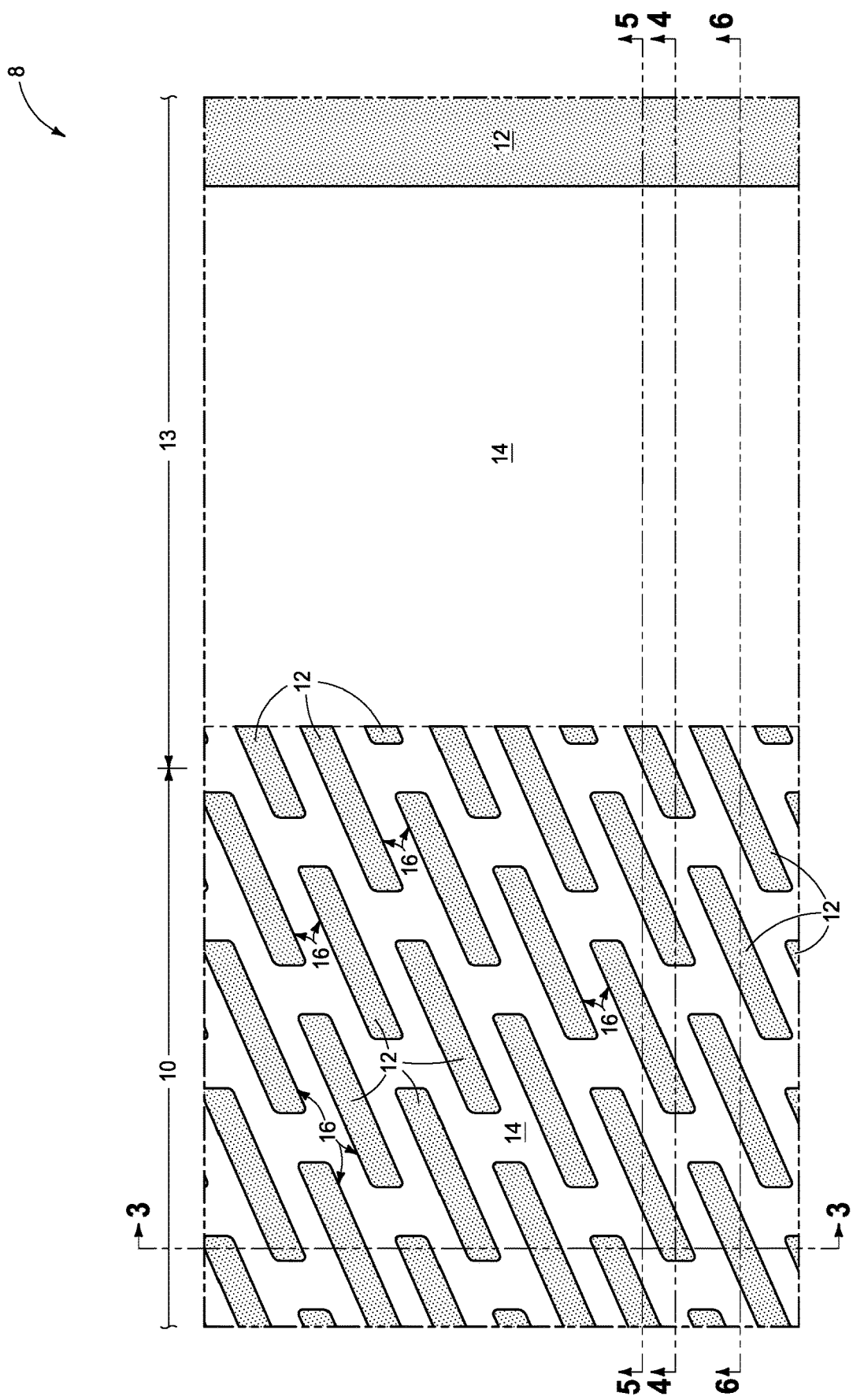
FIG. 7 is a view taken through line 7-7 in FIGS. 3-6.
Figure 8:
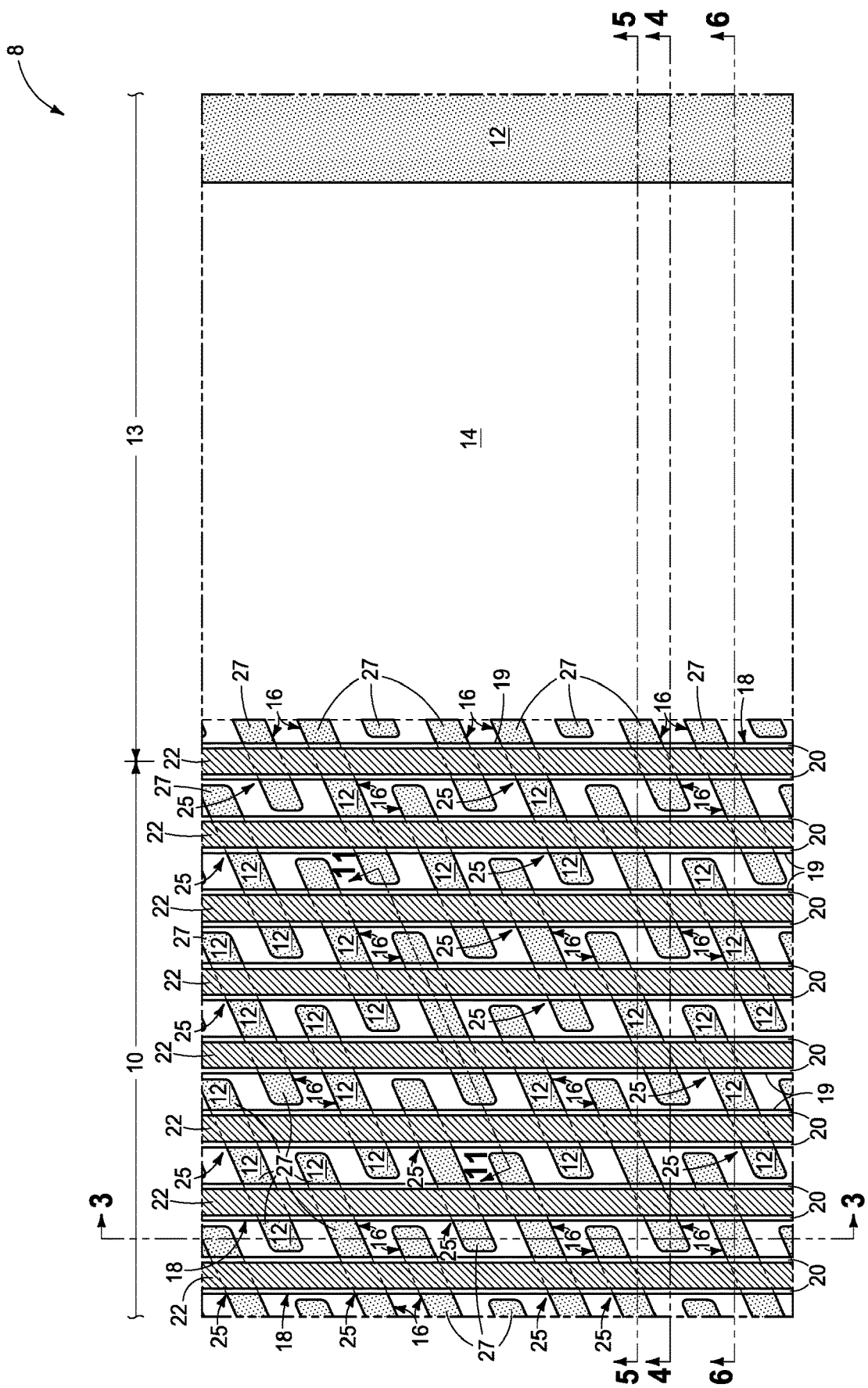
FIG. 8 is a view taken through line 8-8 in FIGS. 3-6.
Figure 12:
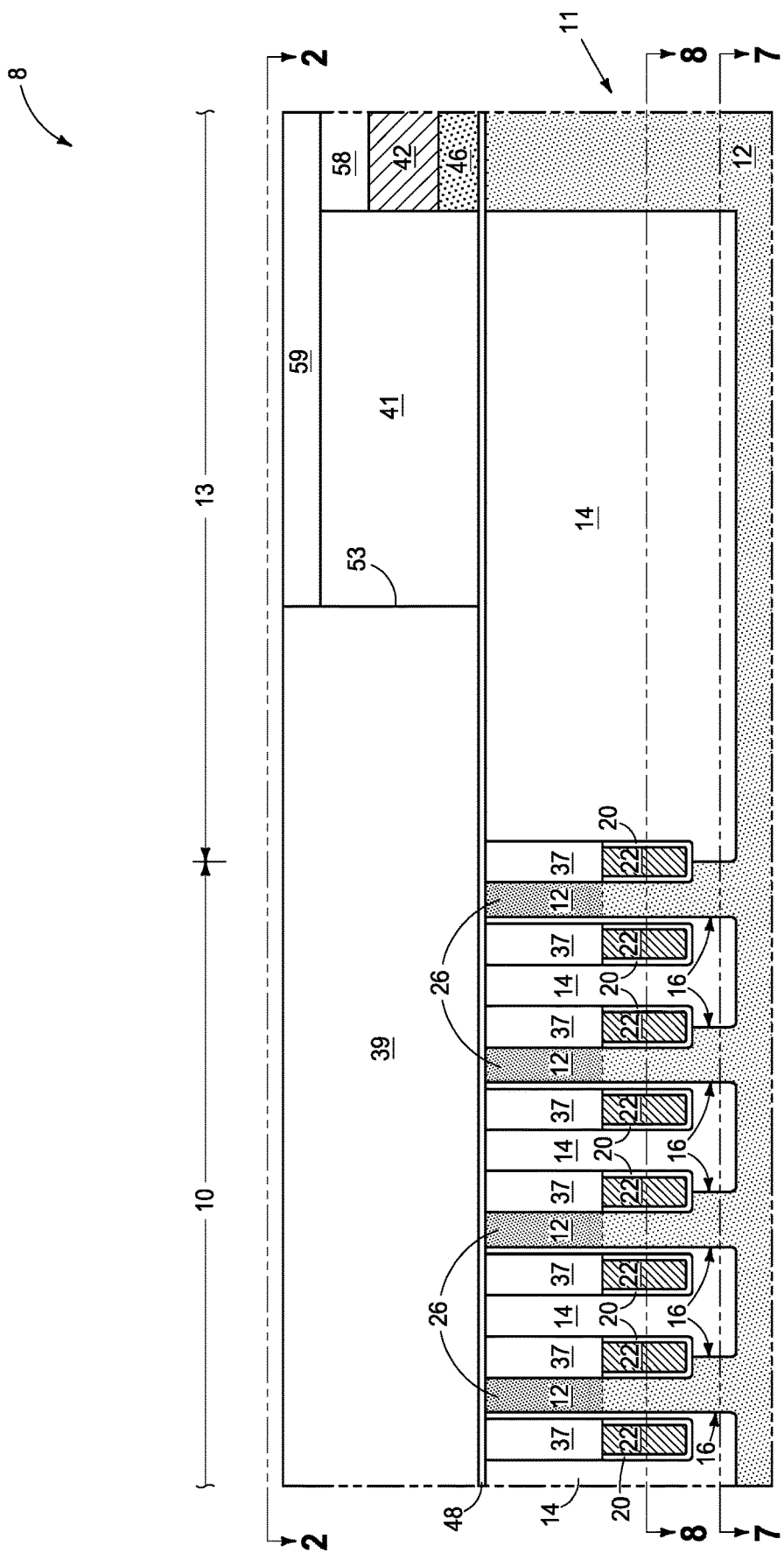
FIG. 12 is a view of a predecessor construction to that of FIG. 4 in an example method of forming the construction as shown in FIG. 4.
Figure 13:
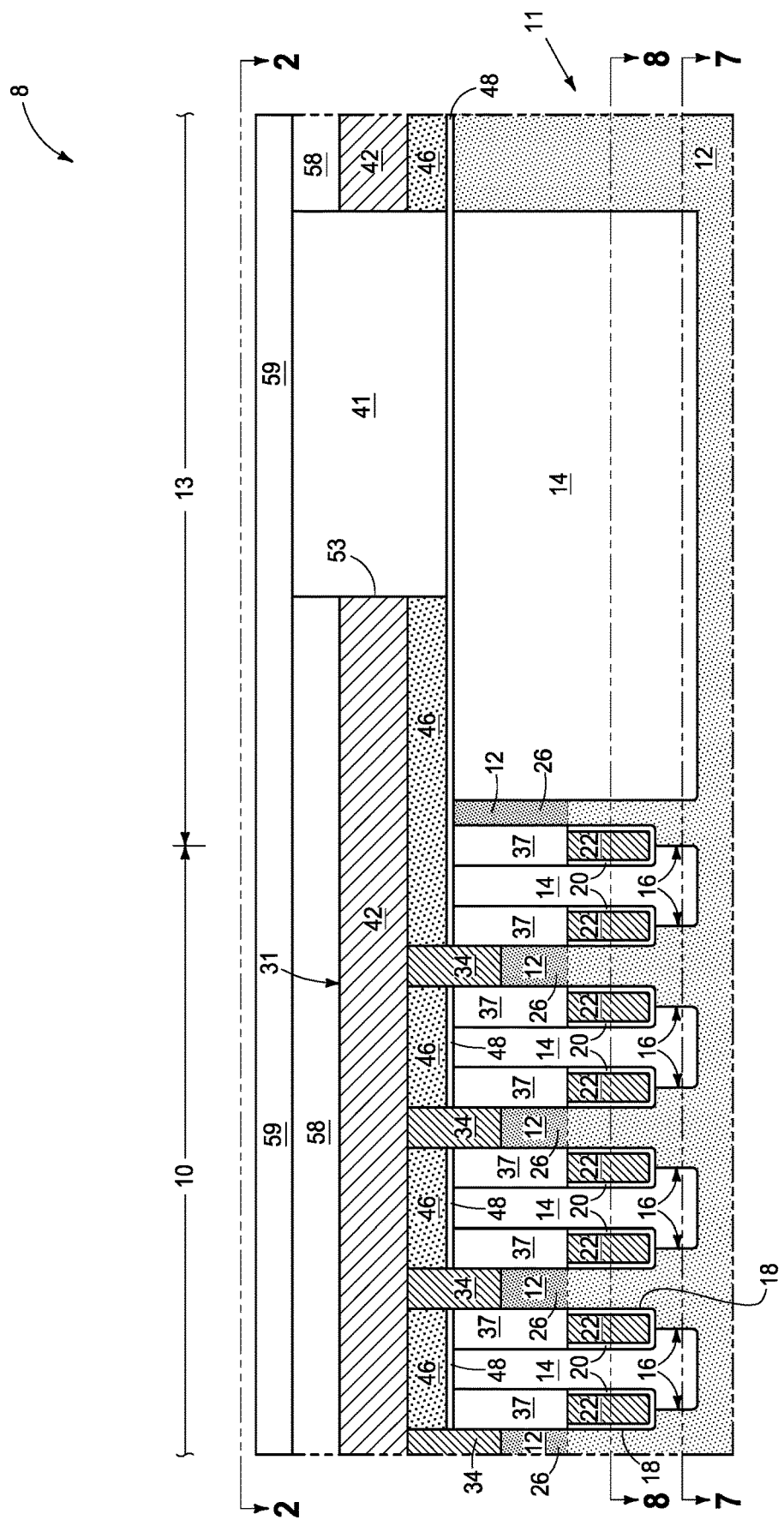
FIG. 13 is a view of a predecessor construction to that of FIG. 5 in an example method of forming the construction as shown in FIG. 5.
Figure 14:
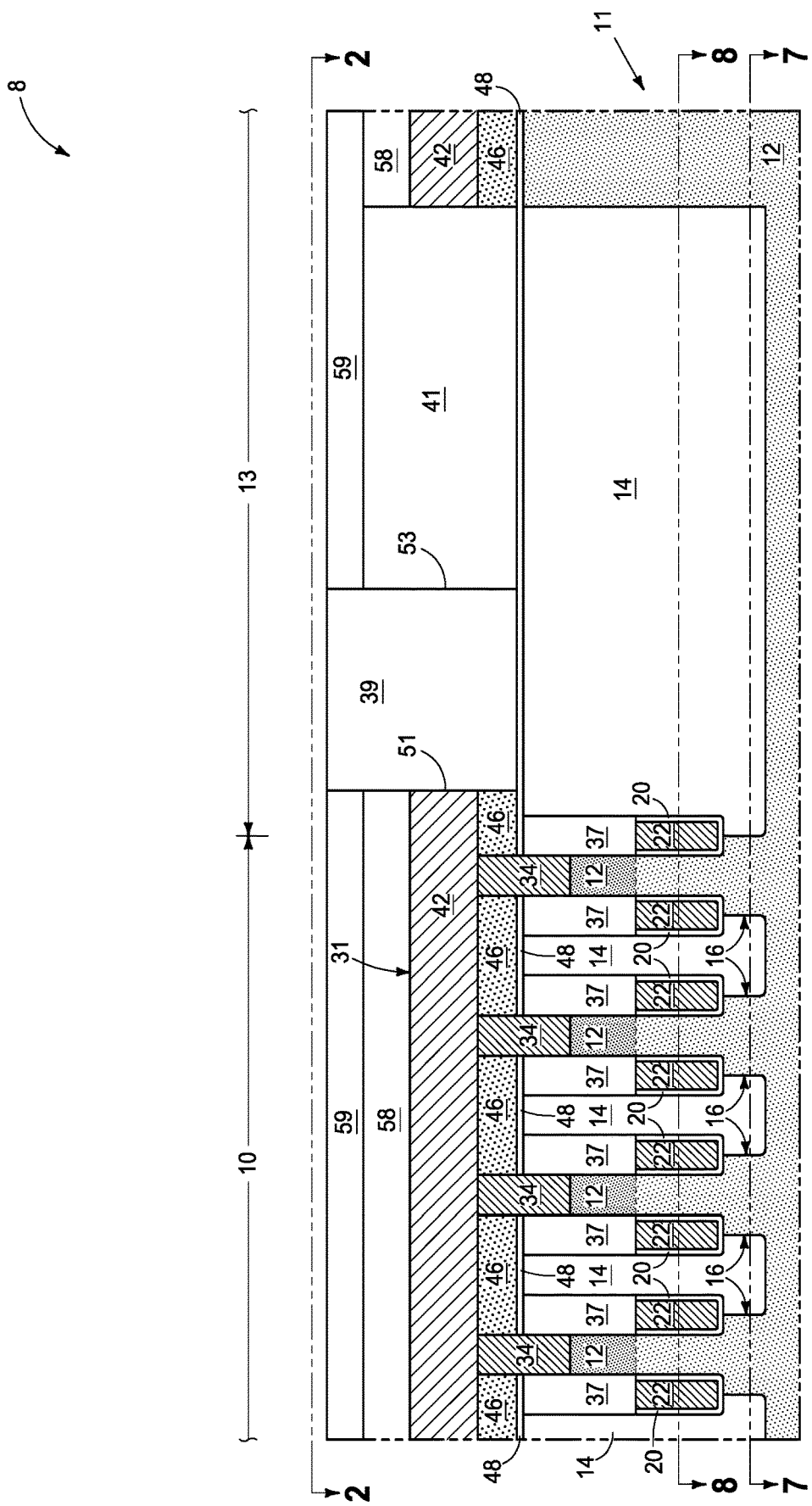
FIG. 14 is a view of a predecessor construction to that of FIG. 6 in an example method of forming the construction as shown in FIG. 6.

FIGS. 12, 13, and 14 show construction 8 at a processing step prior to the substrate shown in FIGS. 4, 5, and 6, respectively. Transistors 25 (not numerically designated) have been previously formed as have vias 34 and bitlines 30, 31. Gate patterning has been conducted for peripheral transistors (not shown) in peripheral area 13 while memory cell array area 10 was masked. Spaces among such gate patterns have been filled with dielectric material 41 (e.g., spin-on-SiO$_2$). Insulator material 59 (e.g., Si$_3$N$_4$) has subsequently been deposited over the substrate, and thereafter bitlines 30 and 31 were patterned in memory cell array area 10 while covering peripheral area 13. Spaces between and among bitlines 30, 31 have been filled with dielectric material 39 (e.g., SiO$_2$ formed in a spin-on manner).

Figure 15:
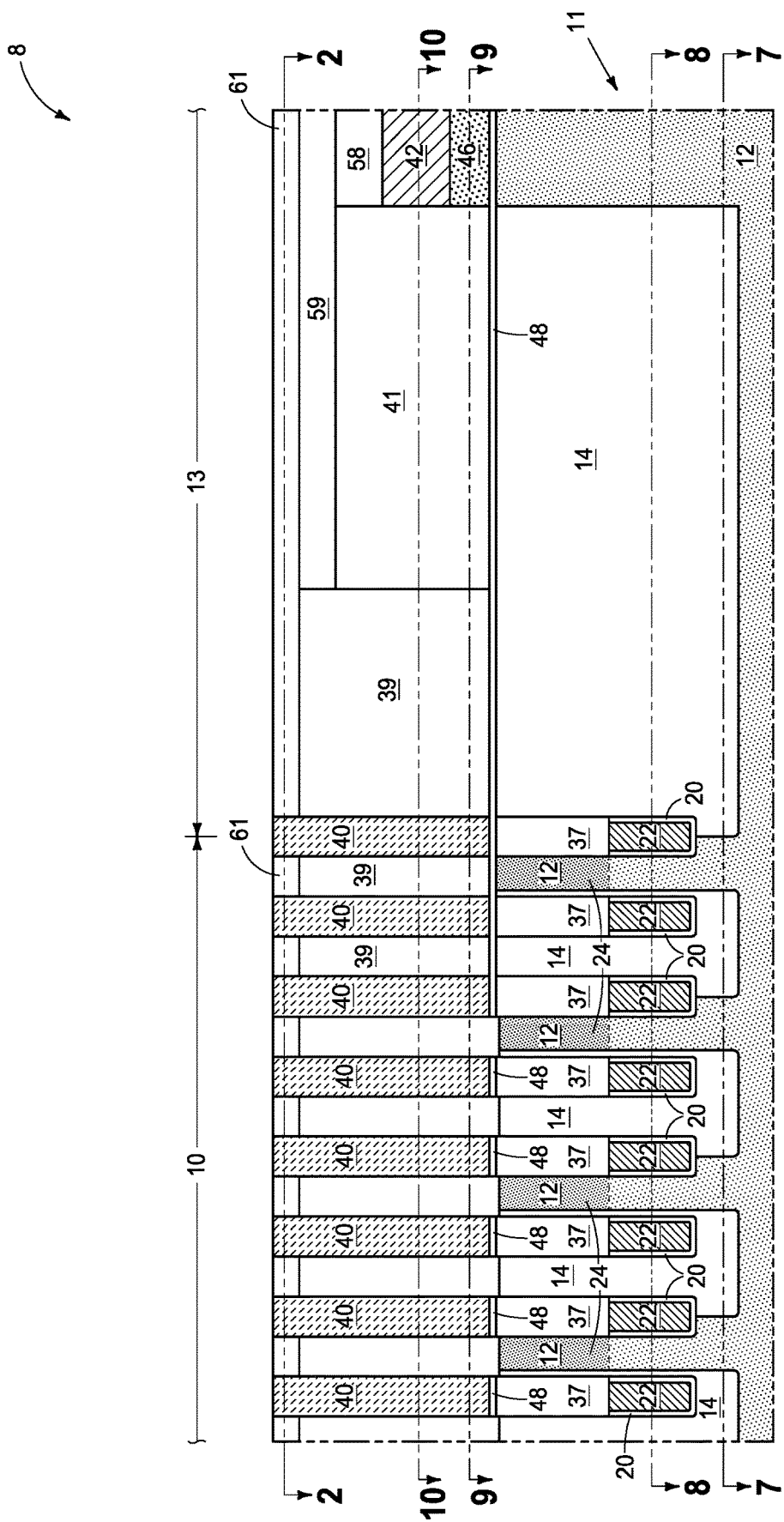
FIG. 15 is a view of the FIG. 12 construction at a processing step subsequent to that shown by FIG. 12.
Figure 16:
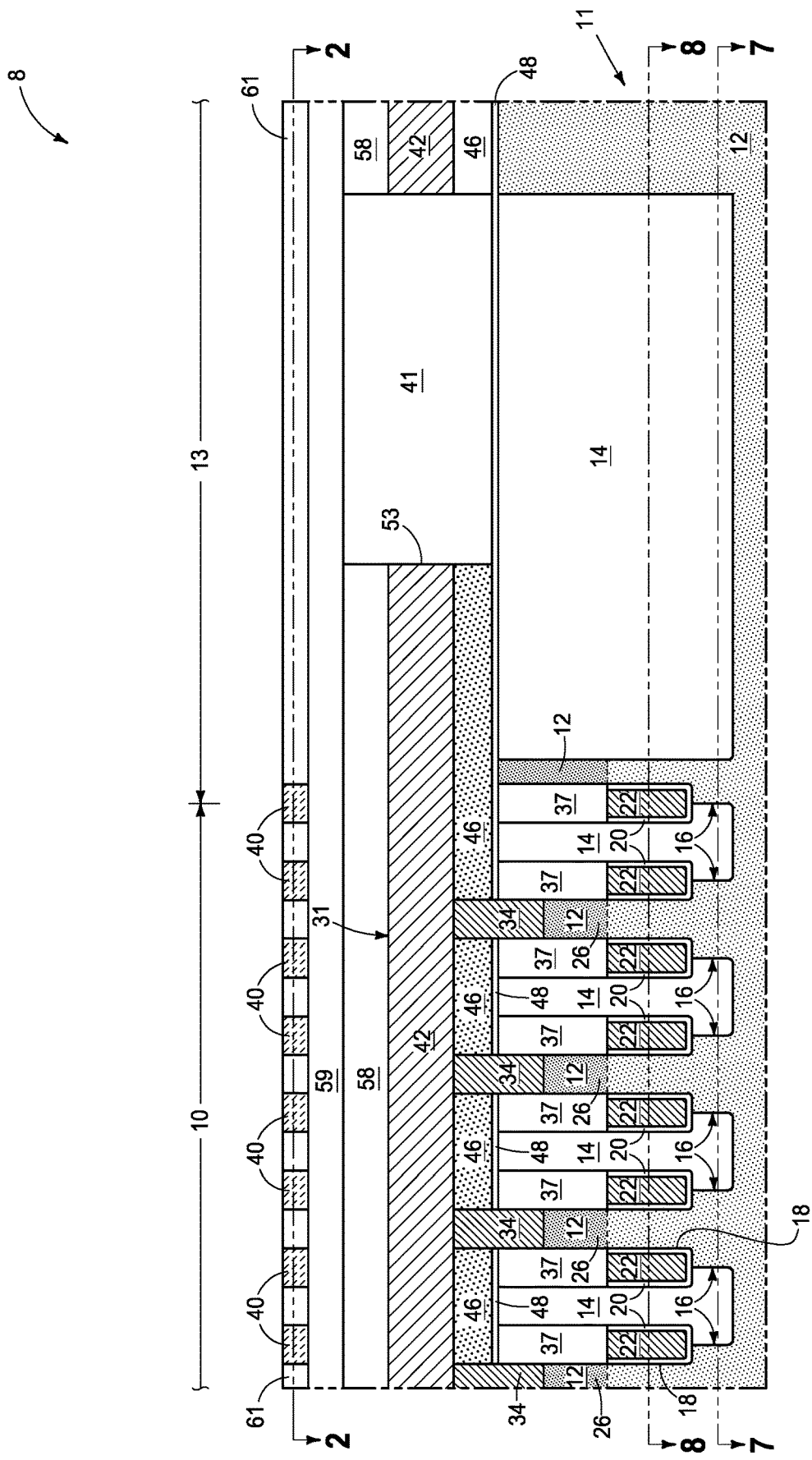
FIG. 16 is a view of the FIG. 13 construction at a processing step subsequent to that shown by FIG. 13.
Figure 17:
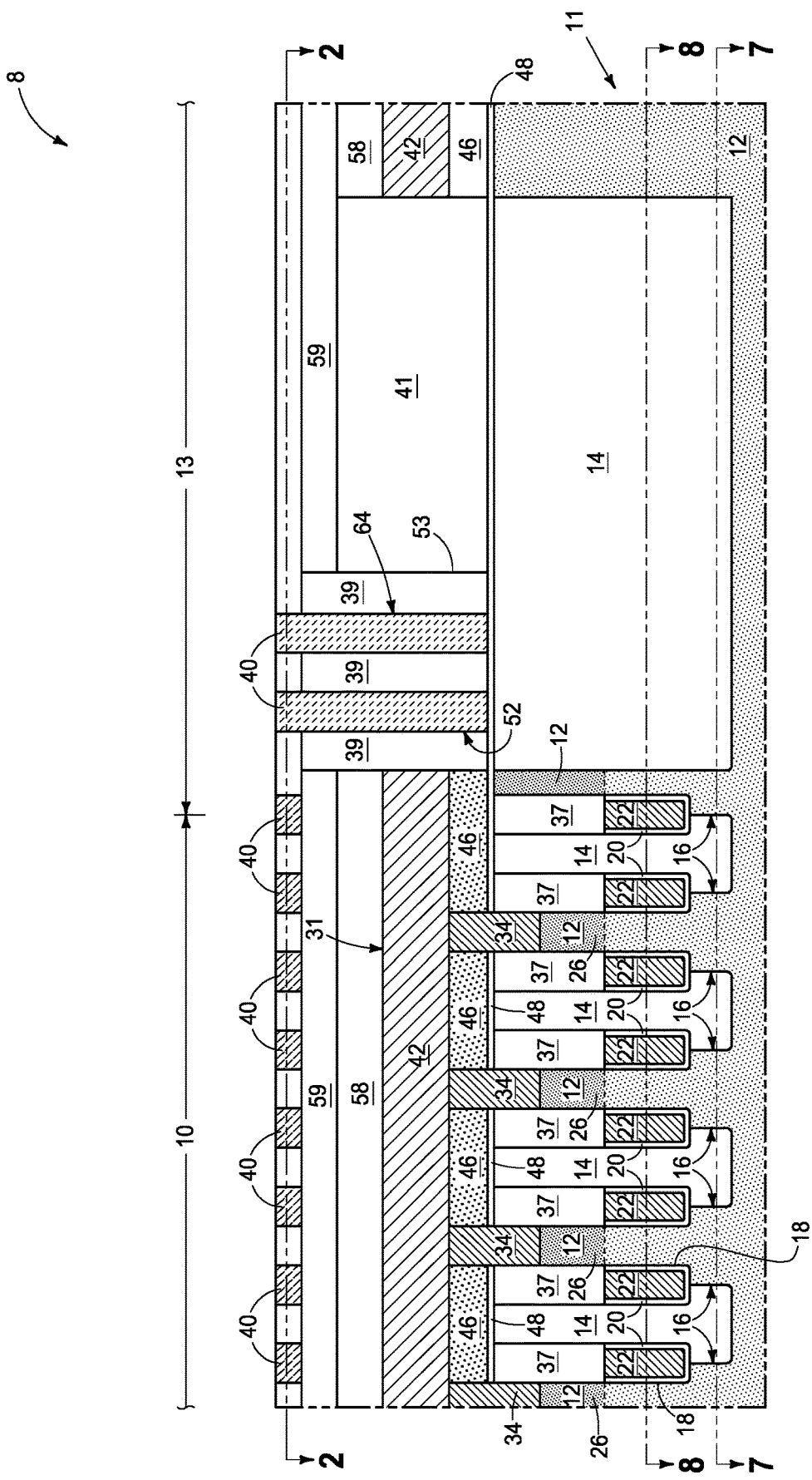
FIG. 17 is a view of the FIG. 14 construction at a processing step subsequent to that shown by FIG. 14.

Referring to FIGS. 15-17, an example SiO$_2$ layer 61 has been formed over the substrate, for example to adjust the height of memory cell contact walls to be formed later. Trenches may be formed for such cell contact walls in the cell array area. Simultaneously therewith, trenches for walls 52 and 64 are formed in peripheral area 13. According to prior art techniques, only trenches for the cell contact walls would be formed in the array area. Material 40 is thereafter deposited over the entire surface to fill over and within the trenches, followed by planarizing such back to form walls 52 and 64.

Figure 18:
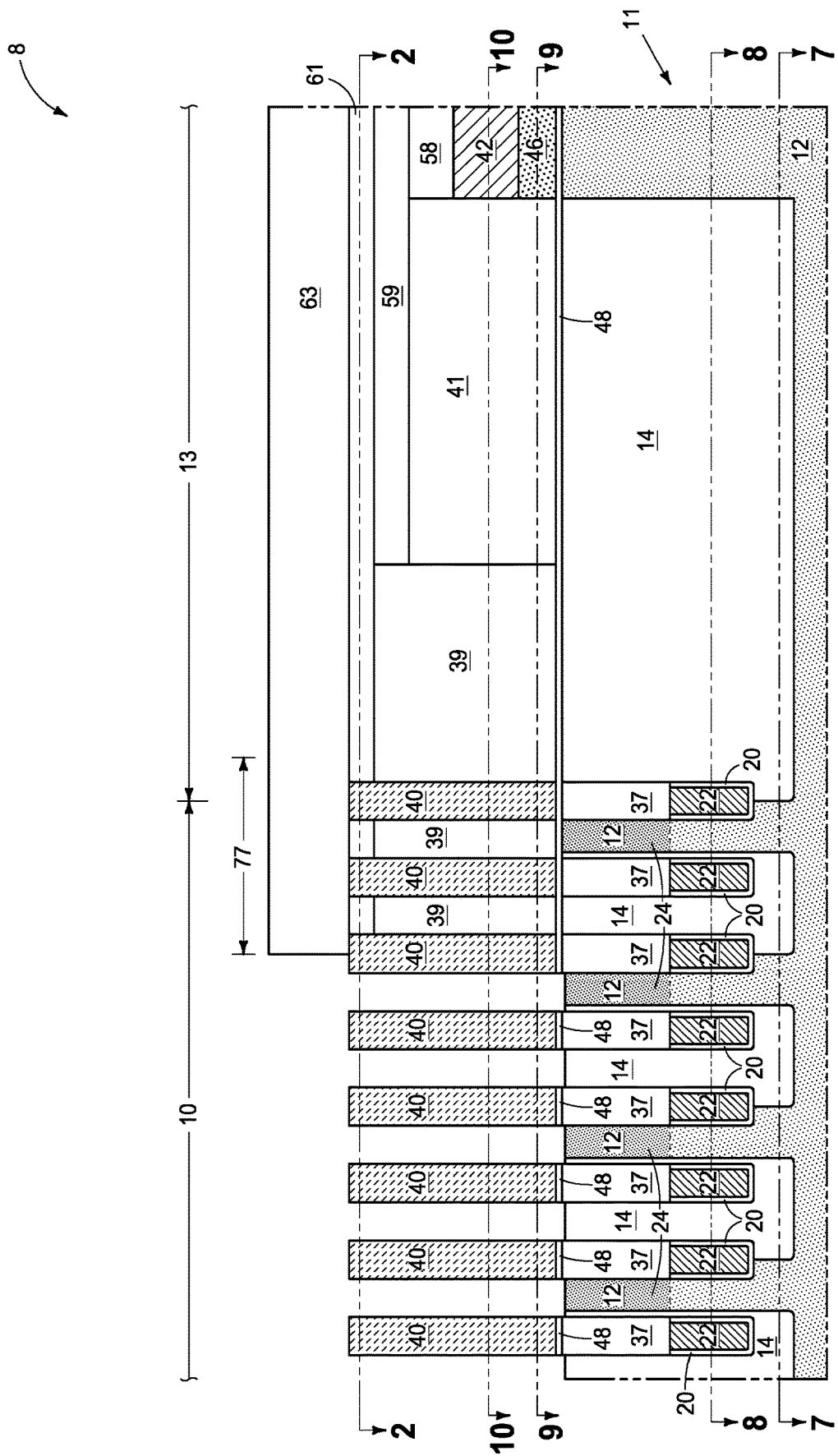
FIG. 18 is a view of the FIG. 15 construction at a processing step subsequent to that shown by FIG. 15.
Figure 19:
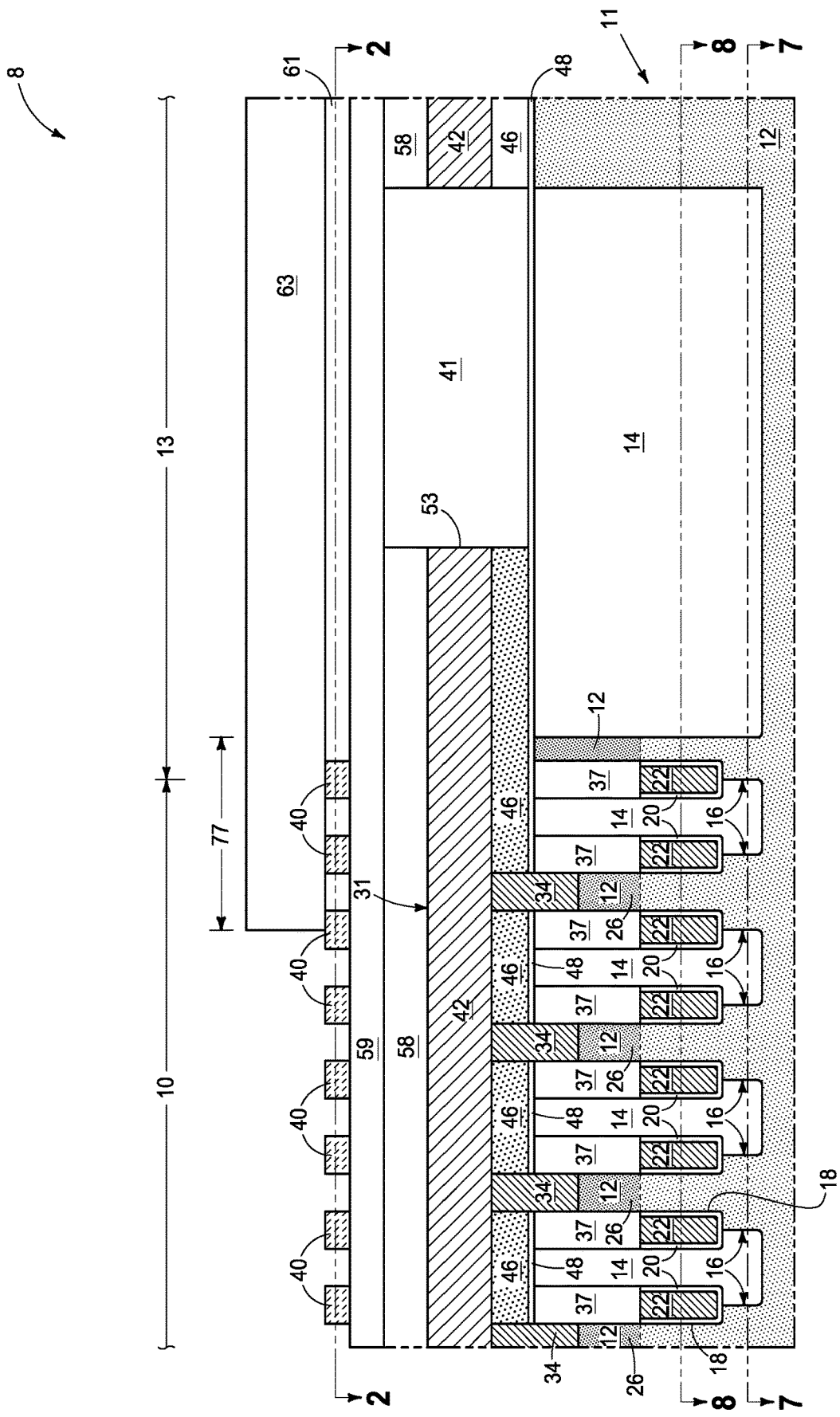
FIG. 19 is a view of the FIG. 16 construction at a processing step subsequent to that shown by FIG. 16.
Figure 20:
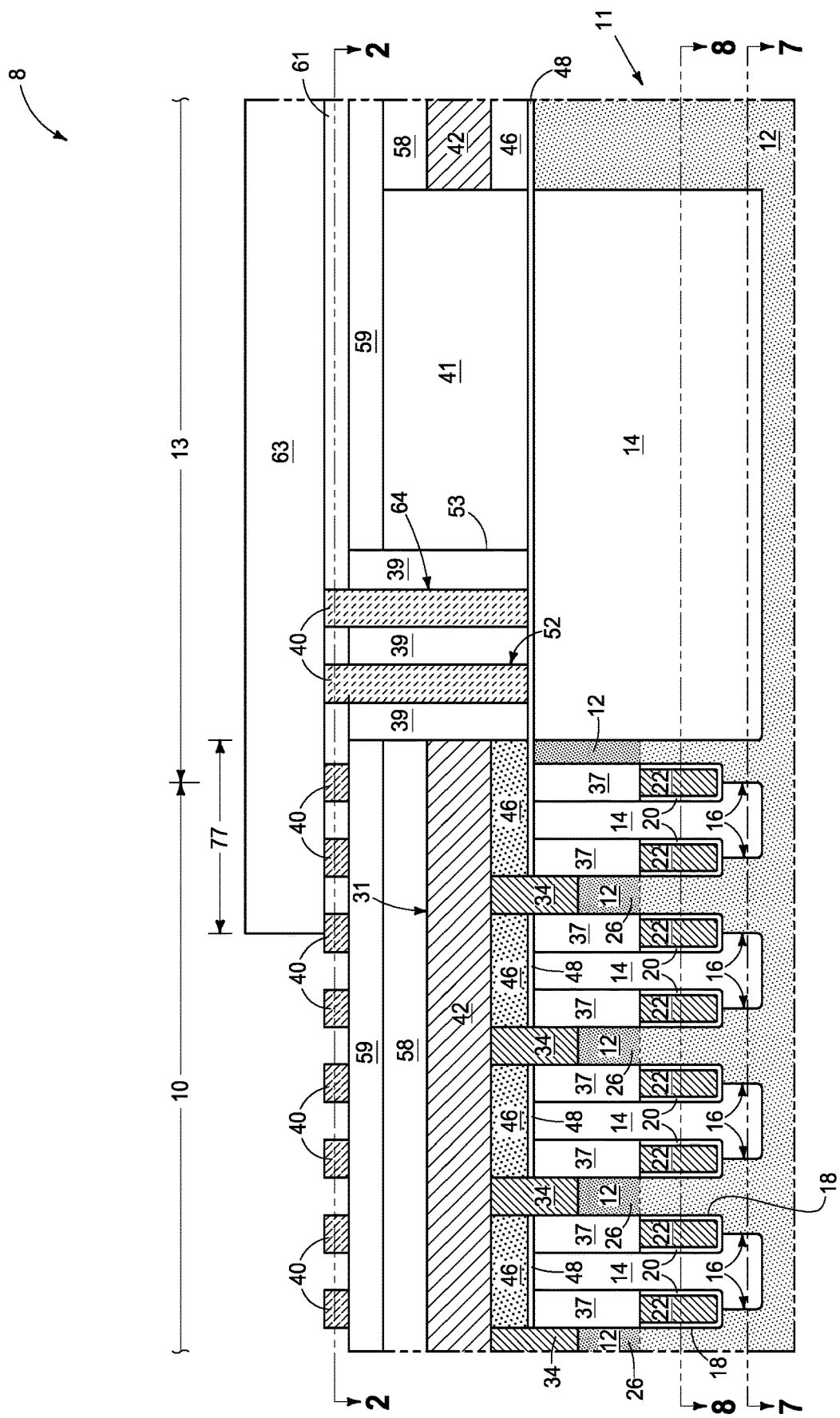
FIG. 20 is a view of the FIG. 17 construction at a processing step subsequent to that shown by FIG. 17.

Referring to FIGS. 18-20, peripheral area 13 as well as a dummy portion 77 of memory cell array area 10 is masked with masking material 63 (e.g., photoresist). Such masking material is used as mask while wet or dry etching to remove material 61 selectively relative to other exposed materials.

Figure 21:
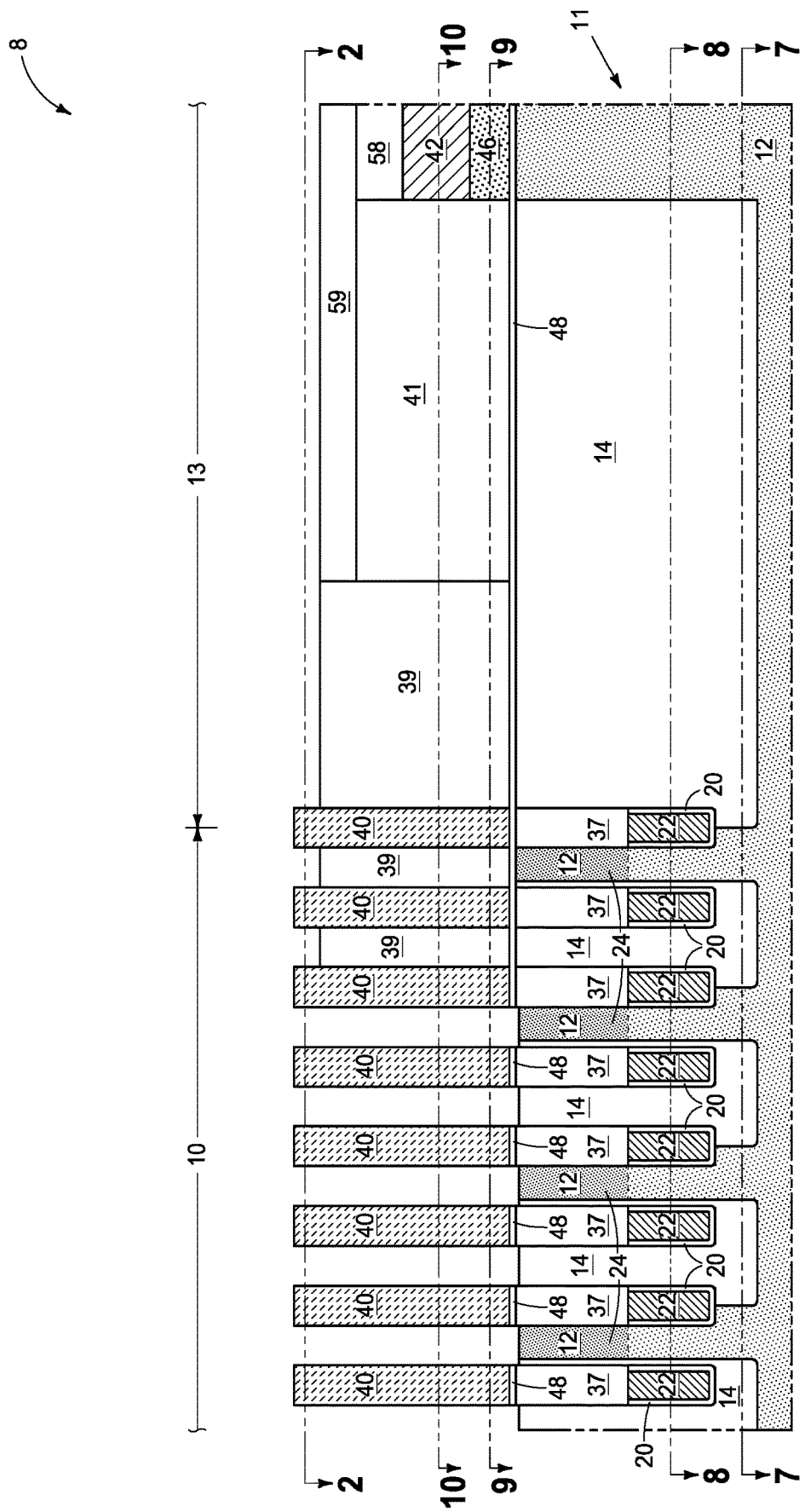
FIG. 21 is a view of the FIG. 18 construction at a processing step subsequent to that shown by FIG. 18.
Figure 22:
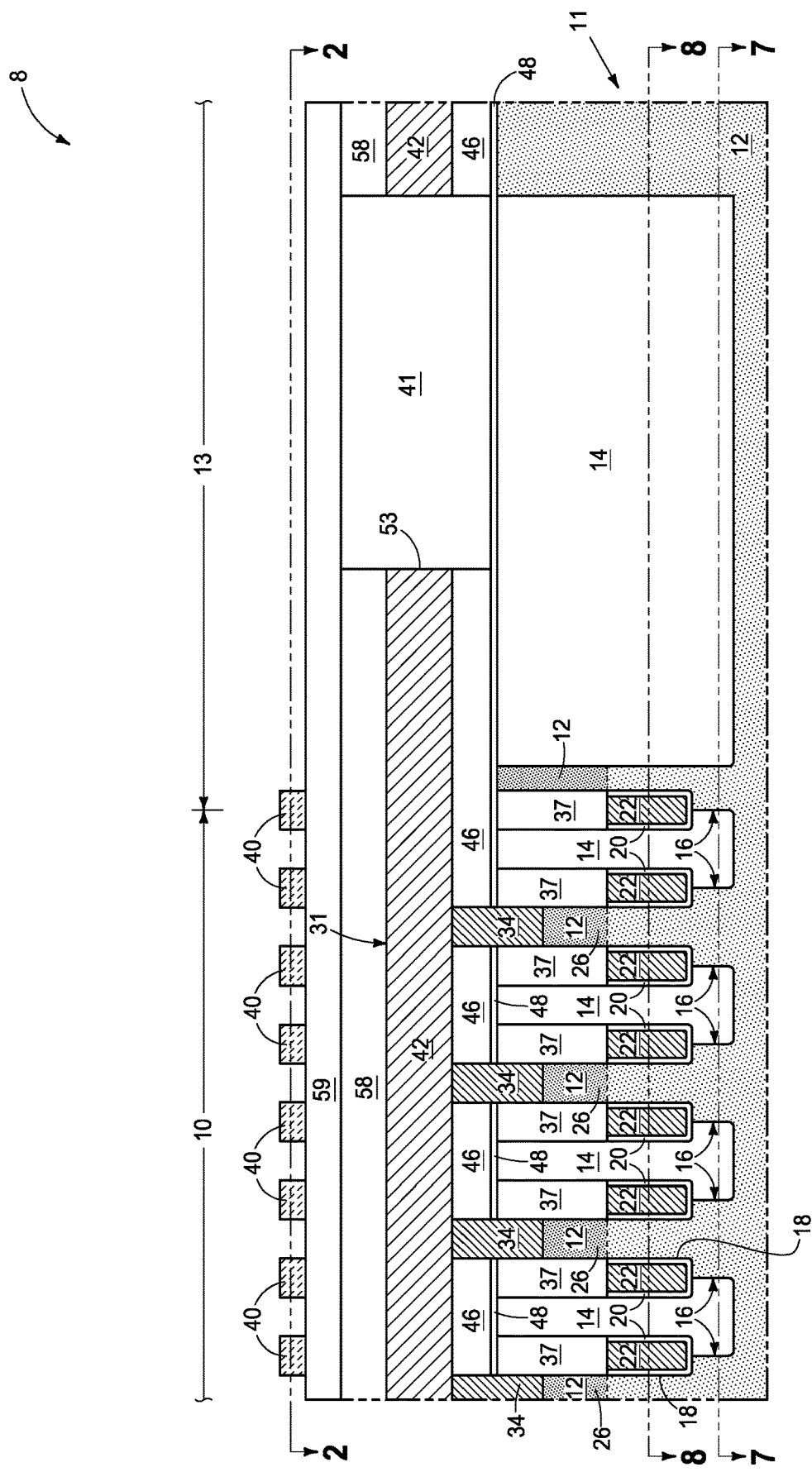
FIG. 22 is a view of the FIG. 19 construction at a processing step subsequent to that shown by FIG. 19.
Figure 23:
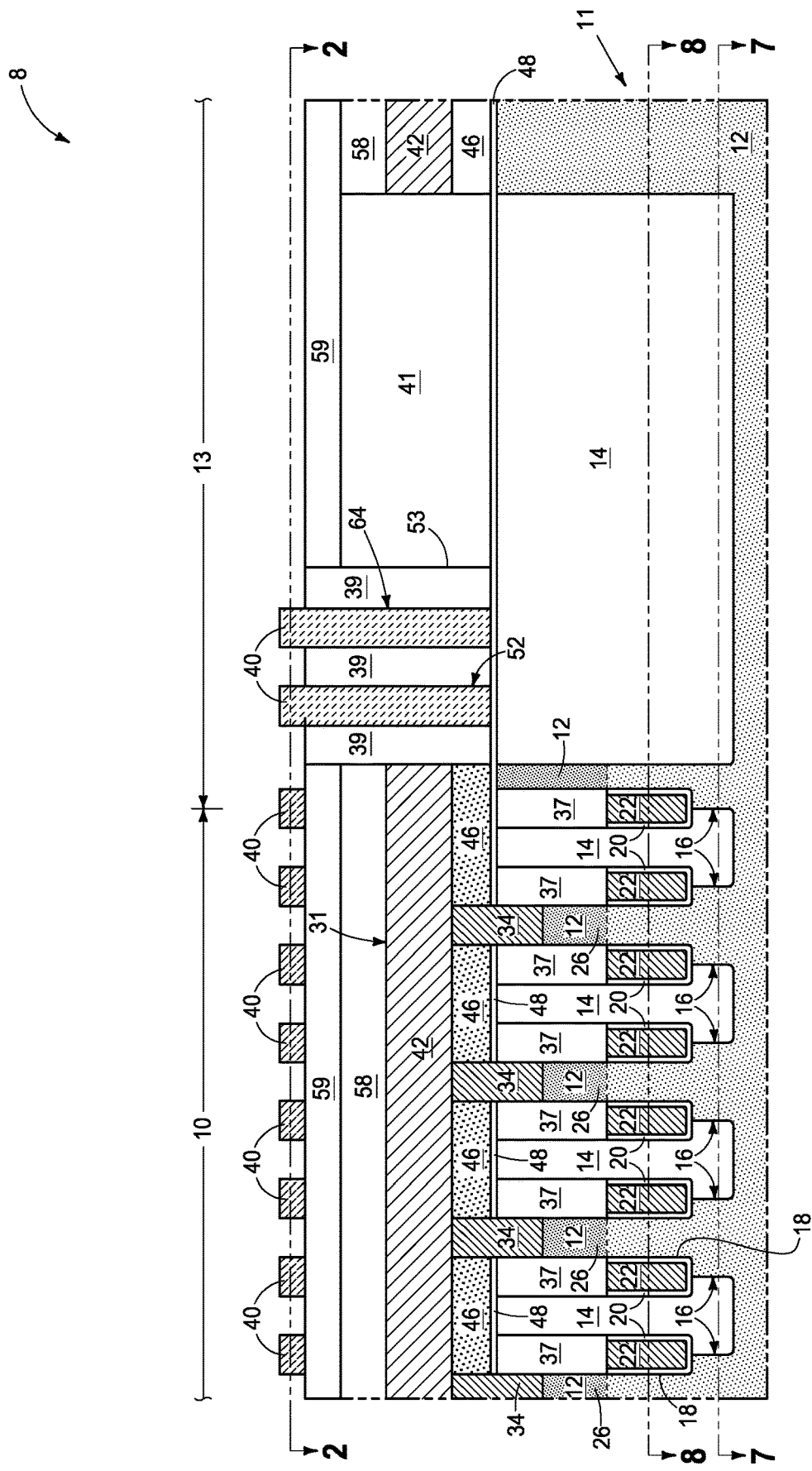
FIG. 23 is a view of the FIG. 20 construction at a processing step subsequent to that shown by FIG. 20.

Referring to FIGS. 21-23, masking material 63 (not shown) has been removed followed by forming memory cell contact holes through material that is over active areas source/drain regions 24. Wet processing (e.g., using dilute HF) may be conducted to removed native oxide that is over exposed portions of active regions and remove any damaged portions of the active regions. Such wet processing may cause uppermost $SiO_2$ material to also be at least lightly etched.

Figure 24:
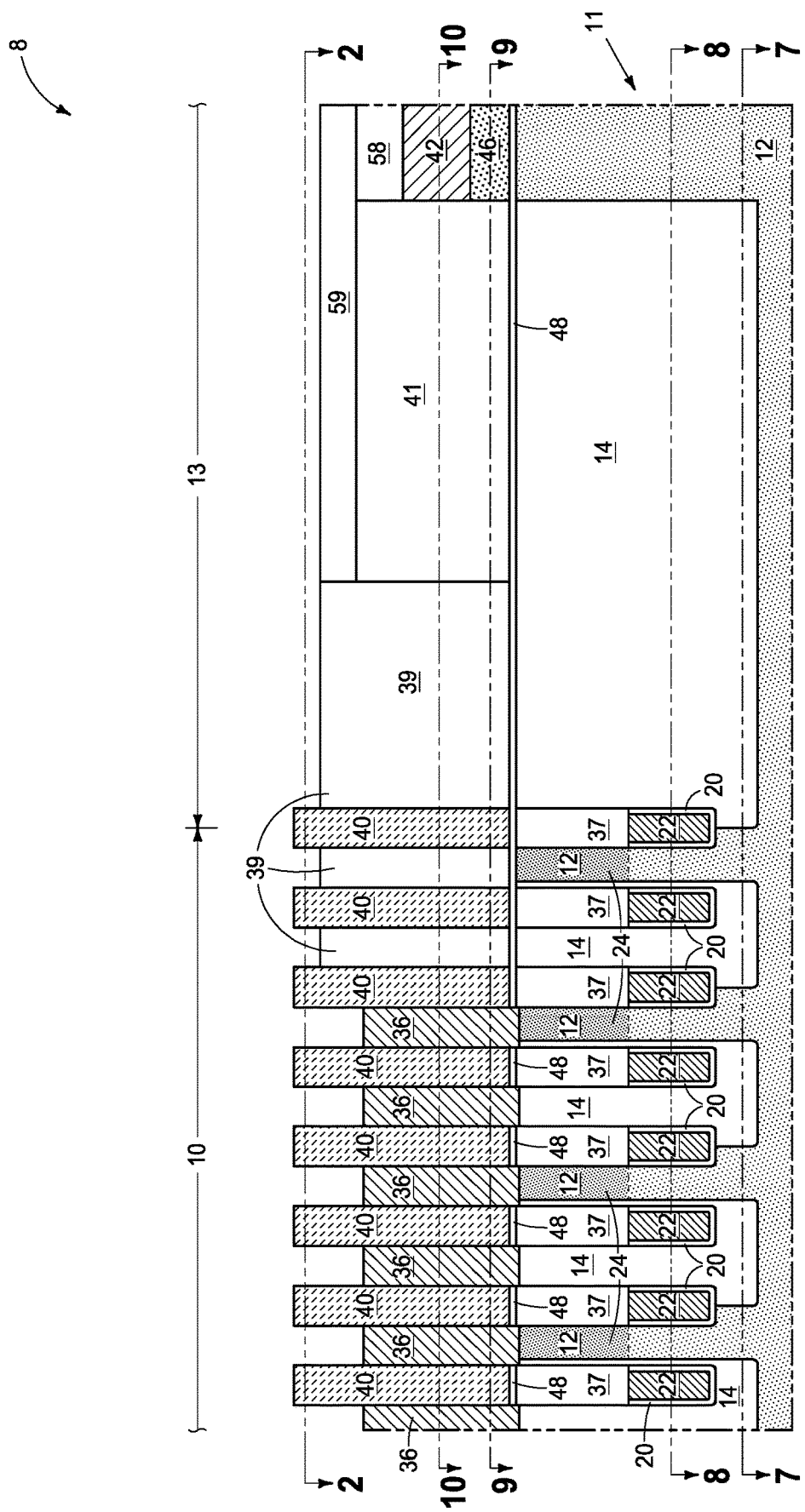
FIG. 24 is a view of the FIG. 21 construction at a processing step subsequent to that shown by FIG. 21.

Referring to FIG. 24, exposed cell contact holes have been at least partially filled with conductive material (e.g., conductively-doped poly silicon) for vias 36, followed by etch-back thereof as shown.

Figure 25:
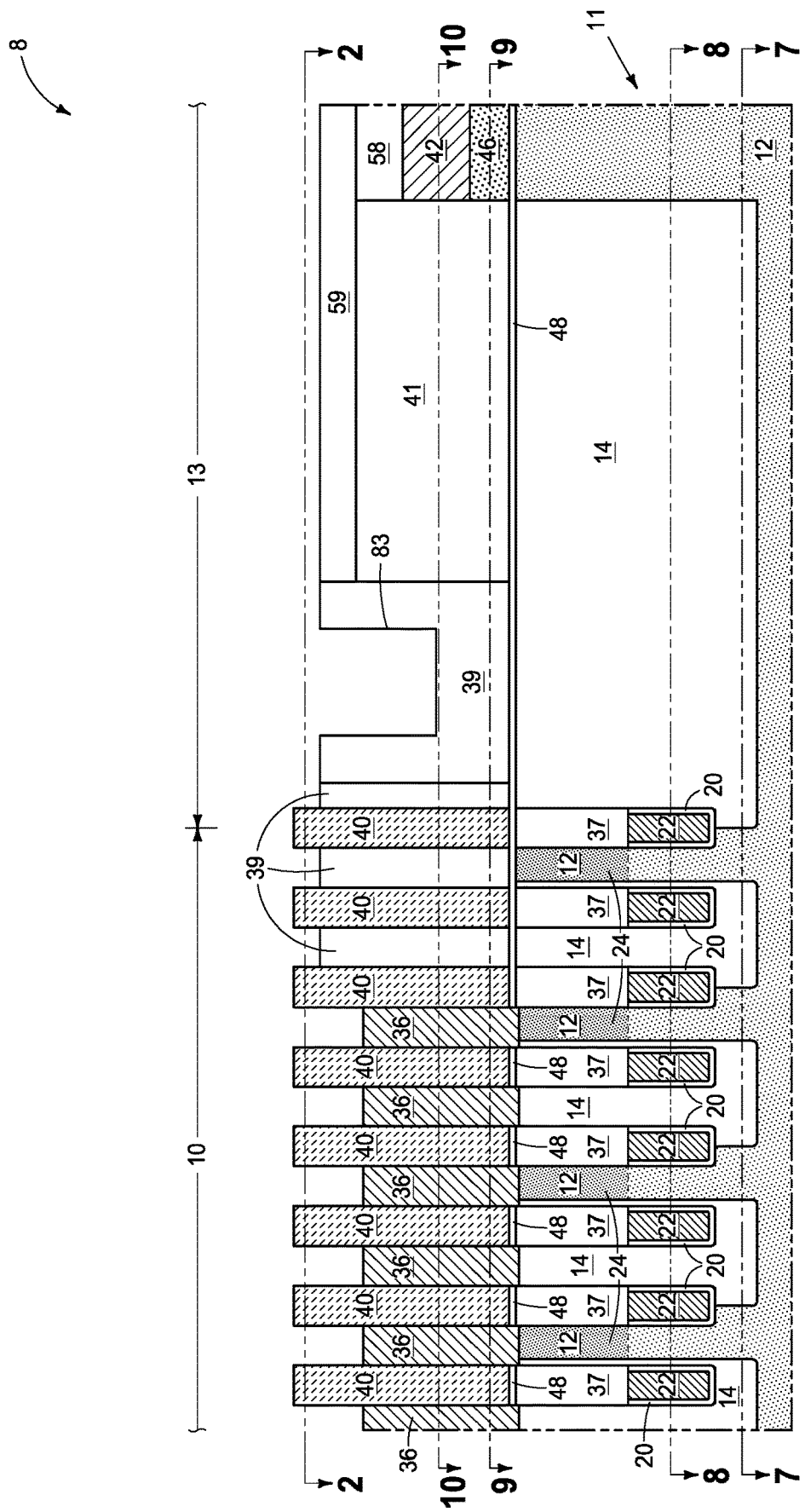
FIG. 25 is a view of the FIG. 24 construction at a processing step subsequent to that shown by FIG. 24.
Figure 26:
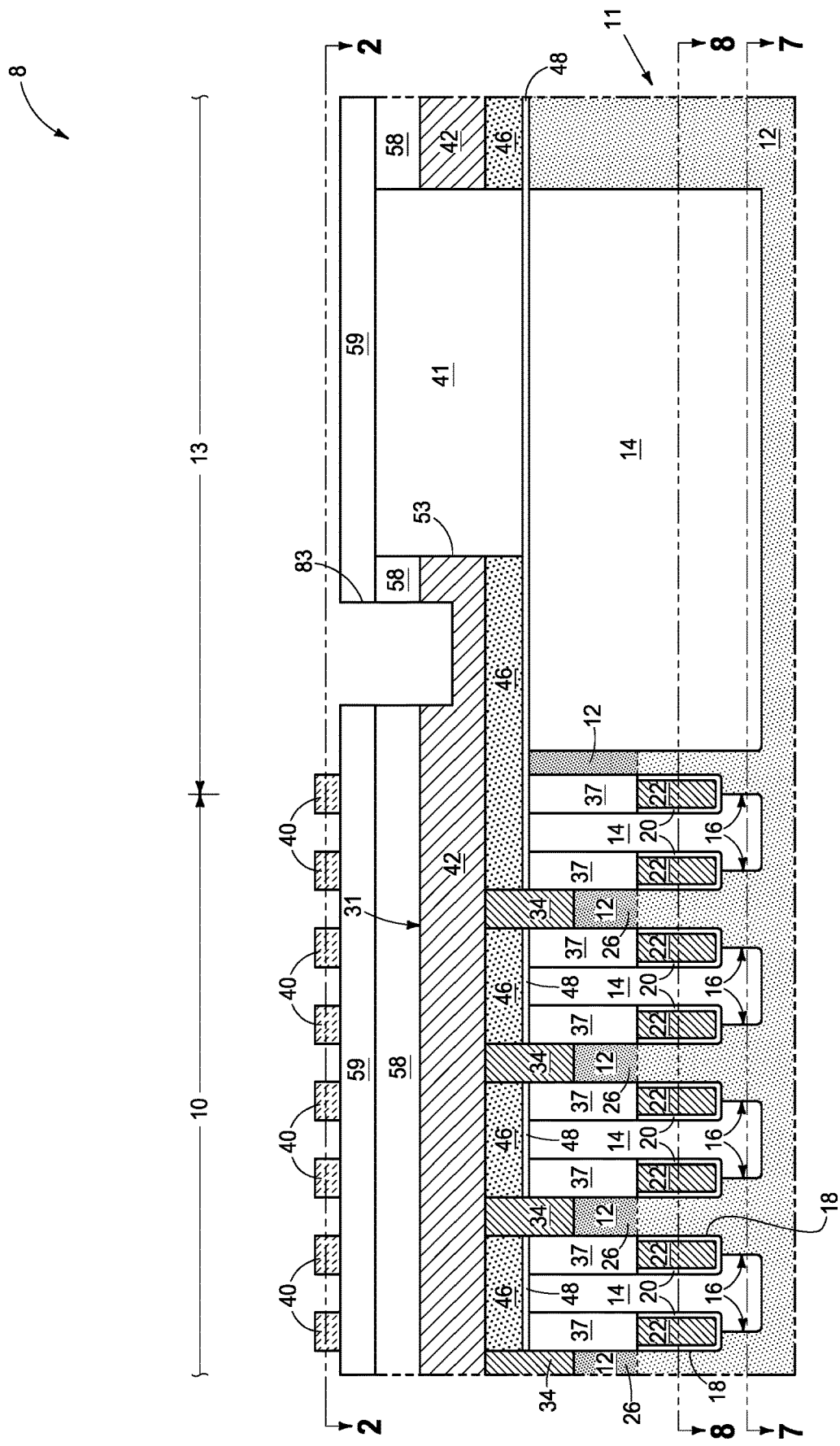
FIG. 26 is a view of the FIG. 22 construction at a processing step subsequent to that shown by FIG. 22.

Referring to FIGS. 25 and 26, bitline contact openings 83 have been formed through the depicted materials at least to conductive material 42 of bitlines 31. Such processing may correspondingly simultaneously occur on the opposite side of the array (not shown) with respect to bit contact openings for bitlines 30).

Figure 27:
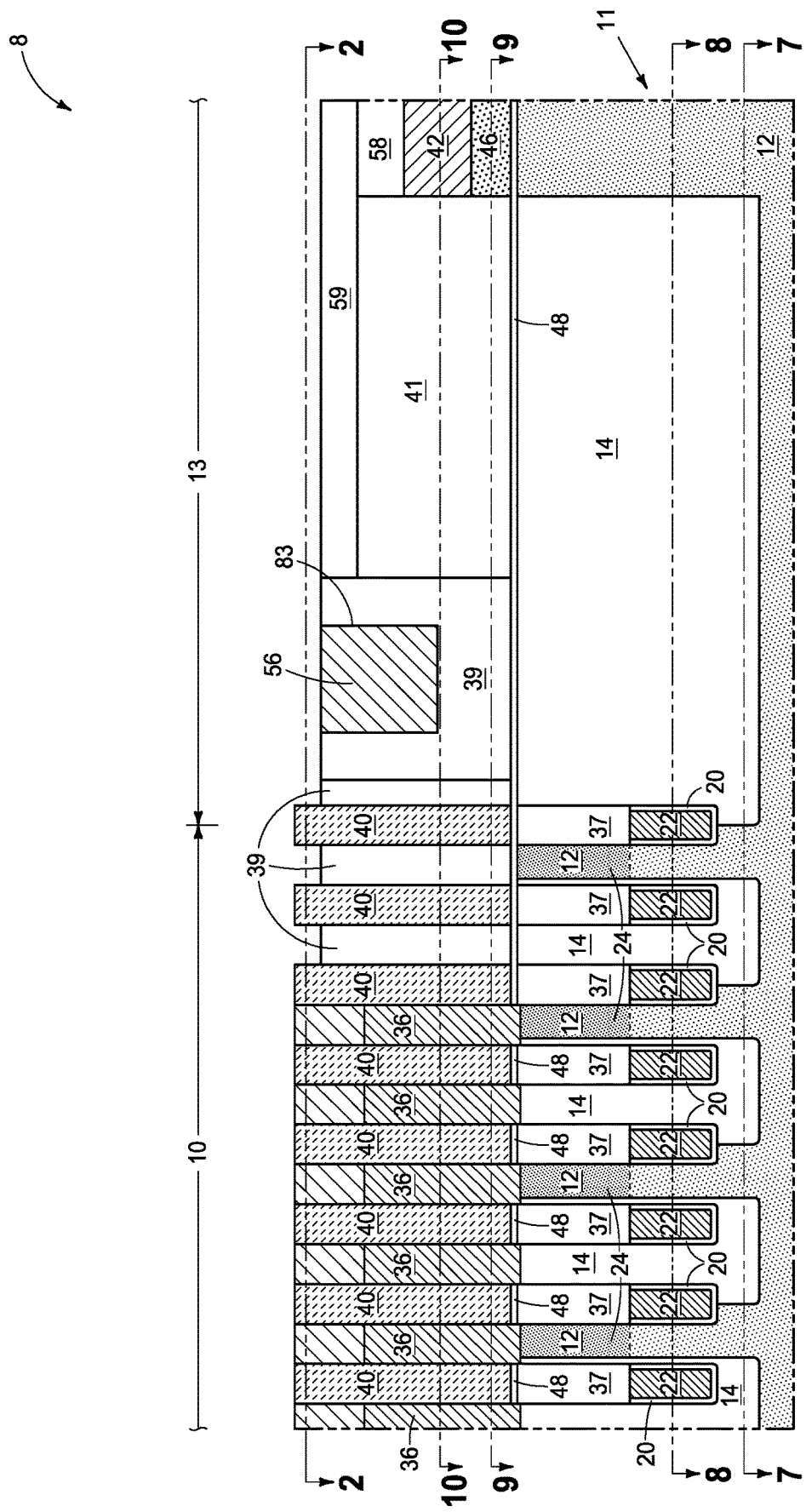
FIG. 27 is a view of the FIG. 25 construction at a processing step subsequent to that shown by FIG. 25.
Figure 28:
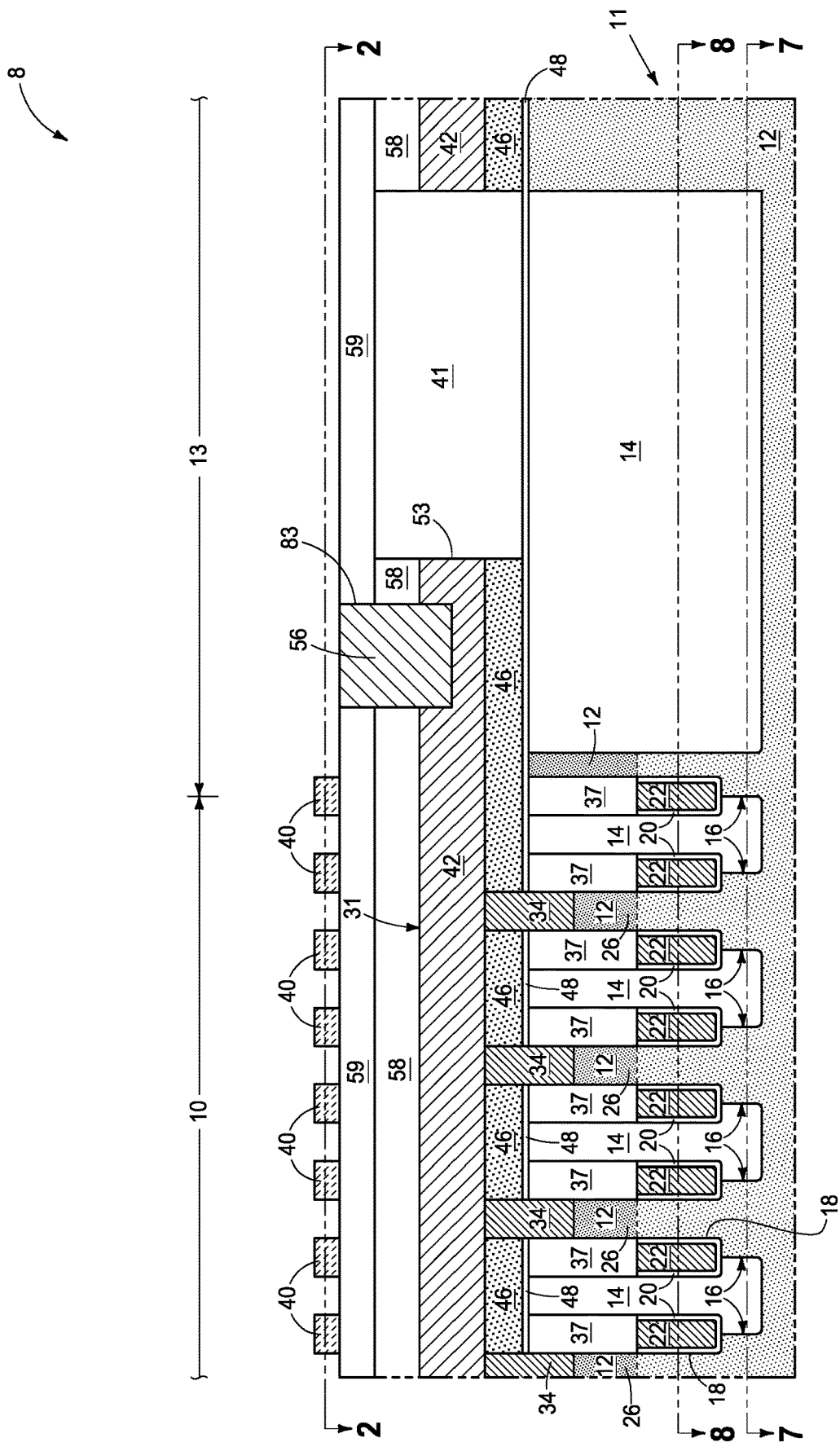
FIG. 28 is a view of the FIG. 26 construction at a processing step subsequent to that shown by FIG. 26.
Figure 29:
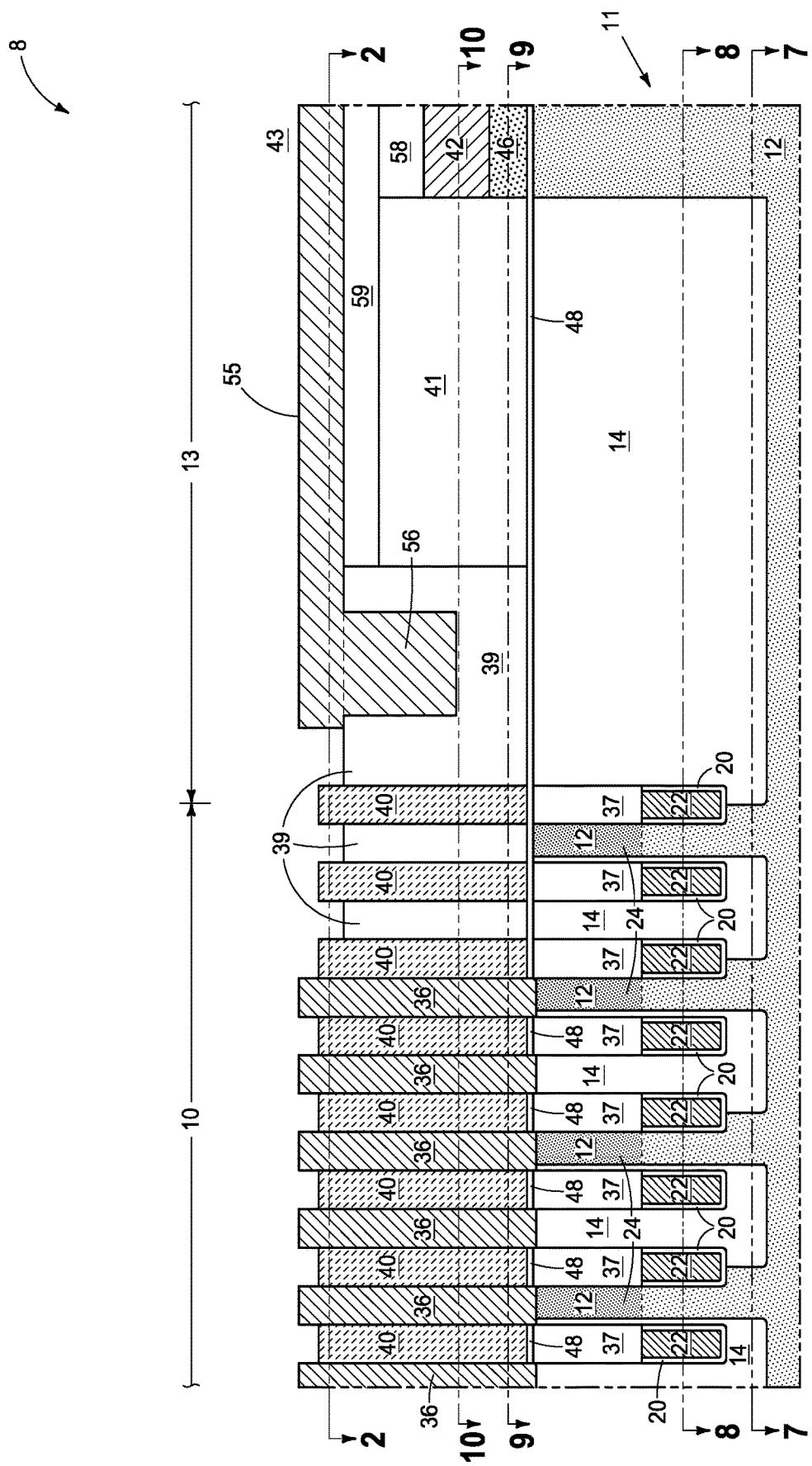
FIG. 29 is a view of the FIG. 27 construction at a processing step subsequent to that shown by FIG. 27.
Figure 30:
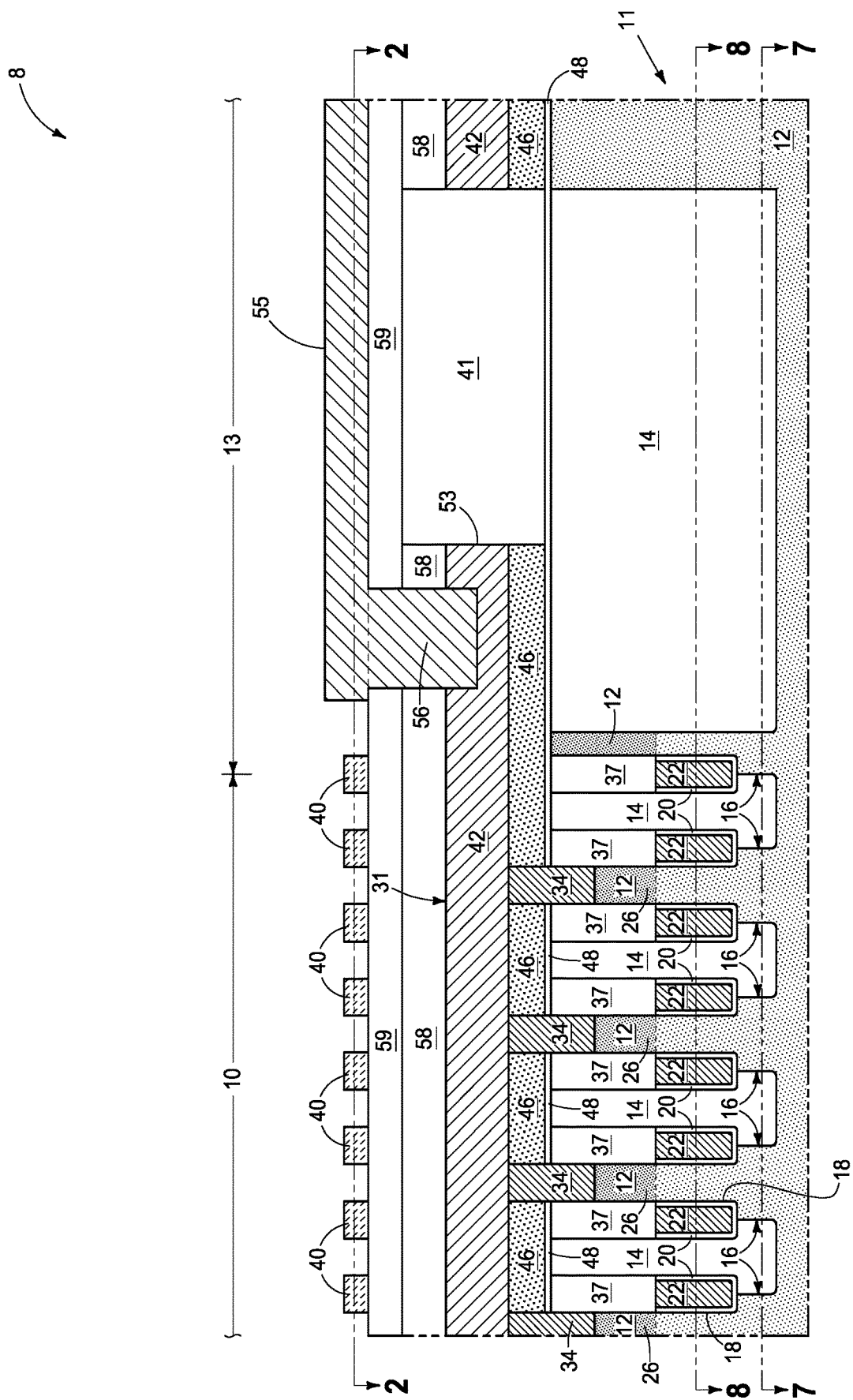
FIG. 30 is a view of the FIG. 28 construction at a processing step subsequent to that shown by FIG. 28.

Referring to FIGS. 27 and 28, openings 83 have been filled and polished back to form vias 56. FIGS. 29 and 30 show subsequent processing in formation of conductive lines 55 thereover.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector. In some embodiments, any component, feature, and/or region that extends elevationally extends vertically or within 10° of vertical.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

CONCLUSION

In some embodiments, an integrated circuitry construction comprises a first area and a second area aside the first area. Laterally-alternating first and second conductive lines extend from the first area into the second area. The second conductive lines extend laterally deeper into the second area on one side of the first area than the first conductive lines and comprise pairs of immediately-laterally-adjacent of the second conductive lines. Insulative material is in the second area laterally between the immediately-laterally-adjacent second conductive lines in individual of the pairs. An elevationally-extending wall of insulator material is within the insulative material in the second area. The wall extends laterally between immediately-laterally-adjacent of the second conductive lines within the respective individual pair and laterally all across the first conductive line that is laterally between the immediately-laterally-adjacent second conductive lines within the respective individual pair. The insulator material is of different composition from that of the insulative material. Third conductive lines are in the second area above the second conductive lines. The third conductive lines individually directly electrically couple with individual of the second conductive lines through an elevationally-extending conductive via in the second area.

In some embodiments, an integrated circuitry construction comprises a memory array area comprising memory cells. A peripheral area comprises peripheral circuitry to read from and write to the memory cells in the memory array area. The peripheral area is aside the memory array area. Laterally-alternating first and second digitlines extend from the memory array area into the peripheral area. The second digitlines extend laterally deeper into the peripheral area on one side of the memory array area than the first digitlines and comprise pairs of immediately-laterally-adjacent of the second digitlines. Insulative material is in the peripheral area laterally between the immediately-laterally-adjacent second digitlines in individual of the pairs. An elevationally-extending wall of insulator material is within the insulative material in the peripheral area. The wall extends laterally between immediately-laterally-adjacent of the second digitlines within the respective individual pair and laterally all across the first digitline that is laterally between the immediately-laterally-adjacent second digitlines within the respective individual pair. The insulator material is of different composition from that of the insulative material. Conductive lines are in the peripheral area above the second digitlines. The conductive lines individually directly electrically couple with individual of the second digitlines through an elevationally-extending conductive via in the peripheral area.

In some embodiments, an integrated circuitry construction comprises a memory array area comprising memory cells. A peripheral area comprises peripheral circuitry to read from and write to the memory cells in the memory array area. The peripheral area is aside the memory array area. Laterally-alternating first and second digitlines extend from the memory array area into the peripheral area. The second digitlines extend laterally deeper into the peripheral area on one side of the first area than the first digitlines and comprise pairs of immediately-laterally-adjacent of the second digitlines. Insulative material is in the peripheral area laterally between the immediately-laterally-adjacent of the second digitlines in individual of the pairs. The insulative material is laterally between (a) and (b), where (a): the first digitline that is laterally between immediately-laterally-adjacent of the second digitlines within the respective individual pair, and (b): each of the immediately-laterally-adjacent second digitlines within the respective individual pair. An elevationally-extending wall of insulator material is within the insulative material in the peripheral area. The wall extends laterally between immediately-laterally-adjacent of the second digitlines within the respective individual pair and laterally all across the first digitline that is laterally between the immediately-laterally-adjacent second digitlines within the respective individual pair. The wall is everywhere spaced from (c) and (d), where (c): a longitudinal end of the first digitline that is laterally between the immediately-laterally-adjacent second digitlines within the respective individual pair, and (d): a longitudinal end of each of the immediately-laterally-adjacent second digitlines within the respective individual pair. The insulator material is of different composition from that of the insulative material. Conductive lines are in the peripheral area above the second digitlines. The conductive lines individually directly electrically couple with individual of the second digitlines through an elevationally-extending conductive via in the peripheral area. The wall is directly against facing sidewalls of two immediately-laterally-adjacent of the elevationally-extending conductive vias and/or of two immediately-laterally-adjacent of the conductive lines.

In some embodiments, an apparatus comprises a memory array area comprising a digitline, a wordline, and a memory cell. The digitline extends in a first direction and the wordline extends in a second direction crossing the first direction. A peripheral area is aside the memory array area. The peripheral area comprises a first surface portion and a second surface portion between the memory array area and the first surface portion. Insulative material is over the second surface portion of the peripheral area. At least one wall of insulator material is in the insulative material. The at least one wall of insulator material extends in the second direction. The digitline is terminated to provide a longitudinal end such that a part of the insulative material intervenes between the longitudinal end of the digitline and the at least one wall of insulator material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An integrated circuitry construction comprising:
   a first area;
   a second area aside the first area;
   first and second conductive lines extending from the first area into the second area, the second conductive lines extending laterally deeper into the second area on one side of the first area than the first conductive lines, immediately-laterally-adjacent of the second conductive lines comprising pairs of immediately-laterally-adjacent of the second conductive lines, individual ones of the pairs having at least one of the first conductive lines laterally between their immediately-laterally-adjacent second conductive lines;
   insulative material in the second area, the insulative material being laterally between the immediately-laterally-adjacent second conductive lines that are in the individual ones of the pairs;
   an elevationally-extending wall of insulator material within the insulative material in the second area, the elevationally-extending wall extending laterally between the immediately-laterally-adjacent second conductive lines that are within the individual ones of the pairs and laterally all across the at least one first conductive line that is laterally between the immediately-laterally-adjacent second conductive lines within the individual ones of the pairs, the insulator material being of different composition from that of the insulative material; and third conductive lines in the second area above the second conductive lines, the third conductive lines individually directly electrically coupling with individual ones of the second conductive lines through an elevationally-extending conductive via in the second area.

2. The construction of claim 1 wherein the elevationally-extending wall is taller than the first and second conductive lines.

3. The construction of claim 1 wherein the elevationally-extending wall extends vertically deeper than the first and second conductive lines.

4. The construction of claim 1 wherein one of the insulative material and the insulator material is silicon dioxide and the other is silicon nitride.

5. The construction of claim 1 wherein the insulative material is silicon dioxide and the insulator material is silicon nitride.

6. The construction of claim 1 wherein the insulative material is laterally between (a) and (b), where (a): the at least one first conductive line that is laterally between the immediately-laterally-adjacent second conductive lines within the individual ones of the pairs, and (b): each of the immediately-laterally-adjacent second conductive lines within the individual ones of the pairs.

7. The construction of claim 1 wherein the elevationally-extending wall is nowhere directly against the at least one first conductive line that is laterally between the immediately-laterally-adjacent second conductive lines within the individual ones of the pairs.

8. The construction of claim 7 wherein the elevationally-extending wall is everywhere spaced from a longitudinal end of the at least one first conductive line that is laterally between the immediately-laterally-adjacent second conductive lines within the individual ones of the pairs.

9. The construction of claim 8 wherein the insulative material is between the elevationally-extending wall and the longitudinal end.

10. The construction of claim 1 wherein the elevationally-extending wall is everywhere spaced from a longitudinal end of each of the immediately-laterally-adjacent second conductive lines within the individual ones of the pairs.

11. The construction of claim 10 wherein the insulative material is between the elevationally-extending wall and the longitudinal end of each of the immediately-laterally-adjacent second conductive lines within the individual ones of the pairs.

12. The construction of claim 1 wherein the elevationally-extending wall is everywhere spaced from (c) and (d), where (c): a longitudinal end of the at least one first conductive line that is laterally between the immediately-laterally-adjacent second conductive lines within the individual ones of the pairs, and (d): a longitudinal end of each of the immediately-laterally-adjacent second conductive lines within the individual ones of the pairs.

13. The construction of claim 1 wherein the elevationally-extending wall is directly against one of the elevationally-extending conductive vias and/or one of the third conductive lines.

14. The construction of claim 13 wherein the elevationally-extending wall is directly against one of the third conductive lines, the wall being directly against a sidewall of the one third conductive line.

15. The construction of claim 1 wherein the elevationally-extending wall is directly against facing sidewalls of two immediately-laterally-adjacent of the third conductive lines.

16. The construction of claim 1 wherein the elevationally-extending wall does not extend across any of the conductive vias in the second area.

17. The construction of claim 1 comprising another elevationally-extending wall of the insulator material in the second area spaced from the first-stated elevationally-extending wall, the another elevationally-extending wall extending laterally between the immediately-laterally-adjacent second conductive lines within the individual ones of the pairs and laterally all across the at least one first conductive line that is laterally between the immediately-laterally-adjacent second conductive lines within the individual ones of the pairs.

18. The construction of claim 17 wherein the another elevationally-extending wall extends vertically deeper than the first and second conductive lines.

19. The construction of claim 17 wherein the another elevationally-extending wall has opposing sides, the insulative material extending longitudinally along both of the opposing sides of the another elevationally-extending wall.

20. The construction of claim 19 wherein the insulative material is directly against the insulator material of the another elevationally-extending wall on both of the opposing sides of the another elevationally-extending wall.

21. An integrated circuitry construction comprising:
a memory array area comprising memory cells;
a peripheral area comprising peripheral circuitry to read from and write to the memory cells in the memory array area, the peripheral area being aside the memory array area;
first and second digitlines extending from the memory array area into the peripheral area, the second digitlines extending laterally deeper into the peripheral area on one side of the memory array area than the first digitlines, immediately-laterally-adjacent of the second digitlines comprising pairs of immediately-laterally-adjacent of the second digitlines, individual ones of the pairs having at least one of the first digitlines laterally between their immediately-laterally-adjacent second digitlines;
insulative material in the peripheral area, the insulative material being laterally between the immediately-laterally-adjacent second digitlines that are in the individual ones of the pairs;
an elevationally-extending wall of insulator material within the insulative material in the peripheral area, the elevationally-extending wall extending laterally between the immediately-laterally-adjacent second digitlines that are within the individual ones of the pairs and laterally all across the at least one first digitline that is laterally between the immediately-laterally-adjacent second digitlines within the individual ones of the pairs, the insulator material being of different composition from that of the insulative material; and
conductive lines in the peripheral area above the second digitlines, the conductive lines individually directly electrically coupling with individual ones of the second digitlines through an elevationally-extending conductive via in the peripheral area.

22. The construction of claim 21 comprising another elevationally-extending wall of the insulator material in the peripheral area spaced from the first-stated elevationally-extending wall, the another elevationally-extending wall extending laterally between the immediately-laterally-adjacent second digitlines within the individual ones of the pairs and laterally all across the first digitline that is laterally between the immediately-laterally-adjacent second digitlines within the individual ones of the pairs.

23. An integrated circuitry construction comprising:
a memory array area comprising memory cells;
a peripheral area comprising peripheral circuitry to read from and write to the memory cells in the memory array area, the peripheral area being aside the memory array area;
first and second digitlines extending from the memory array area into the peripheral area, the second digitlines extending laterally deeper into the peripheral area on one side of the memory array area than the first digitlines, immediately-laterally-adjacent of the second digitlines comprising pairs of immediately-laterally-adjacent of the second digitlines, individual ones of the pairs having at least one of the first digitlines laterally between their immediately-laterally-adjacent second digitlines;
insulative material in the peripheral area, the insulative material being laterally between the immediately-laterally-adjacent of the second digitlines in the individual ones of the pairs, the insulative material being laterally between (a) and (b), where (a): the first at least one digitline that is laterally between the immediately-laterally-adjacent second digitlines within the individual ones of the pairs, and (b): each of the immediately-laterally-adjacent second digitlines within the individual ones of the pairs;
an elevationally-extending wall of insulator material within the insulative material in the peripheral area, the elevationally-extending wall extending laterally between the immediately-laterally-adjacent second digitlines within the individual ones of the pairs and laterally all across the at least one first digitline that is laterally between the immediately-laterally-adjacent second digitlines within the individual ones of the pairs, the elevationally-extending wall being everywhere spaced from (c) and (d), where (c): a longitudinal end of the at least one first digitline that is laterally between the immediately-laterally-adjacent second digitlines within the individual ones of the pairs, and (d): a longitudinal end of each of the immediately-laterally-adjacent second digitlines within the individual ones of the pairs, the insulator material being of different composition from that of the insulative material;
conductive lines in the peripheral area above the second digitlines, the conductive lines individually directly electrically coupling with individual ones of the second digitlines through an elevationally-extending conductive via in the peripheral area; and
the elevationally-extending wall being directly against facing sidewalls of two immediately-laterally-adjacent of the elevationally-extending conductive vias and/or of two immediately-laterally-adjacent of the conductive lines.

24. The construction of claim 23 wherein,
individual ones of the memory cells have one and only one transistor; and
the memory cells are individually DRAM cells.

25. An apparatus comprising:
a memory array area comprising a digitline, a wordline, and a memory cell, the digitline extending in a first direction, the wordline extending in a second direction crossing the first direction;
a peripheral area aside the memory array area, the peripheral area comprising a first surface portion and a second surface portion between the memory array area and the first surface portion;
insulative material over the second surface portion of the peripheral area; and
at least one wall of insulator material in the insulative material, the at least one wall of insulator material extending in the second direction;
wherein the digitline is terminated to provide a longitudinal end such that a part of the insulative material intervenes between the longitudinal end of the digitline and the at least one wall of insulator material.

26. The apparatus of claim 25 wherein,
the at least one wall of insulator material is divided into first and second partial walls in the second direction to provide a gap therebetween; and
the memory array area further comprises an additional digitline extending in the first direction to pass through the gap between the first and second partial walls.

27. The apparatus of claim 26 further comprising a conductive line electrically coupled to the additional digitline through a conductive plug.

* * * * *